(12) United States Patent
Hiramatsu et al.

(10) Patent No.: US 8,614,898 B2
(45) Date of Patent: Dec. 24, 2013

(54) PRINTED WIRING BOARD, ELECTRONIC DEVICE, AND PRINTED WIRING BOARD MANUFACTURING METHOD

(75) Inventors: Yasuji Hiramatsu, Ibi-gun (JP); Yuki Terada, Ibi-gun (JP); Tetsuya Muraki, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 185 days.

(21) Appl. No.: 13/156,718

(22) Filed: Jun. 9, 2011

(65) Prior Publication Data

US 2011/0304997 A1 Dec. 15, 2011

(30) Foreign Application Priority Data

Jun. 10, 2010 (JP) ................. 2010-133173

(51) Int. Cl.
*H05K 1/18* (2006.01)
*H01H 37/76* (2006.01)

(52) U.S. Cl.
USPC ........... 361/761; 361/736; 361/739; 337/404; 337/182; 337/183; 337/276; 428/209; 428/210; 174/261

(58) Field of Classification Search
USPC ......... 361/760–764, 824, 39, 41, 18, 21, 104; 361/275.4; 428/209, 210; 174/261–262, 174/258; 337/222, 208
See application file for complete search history.

(56) References Cited

U.S. PATENT DOCUMENTS

| | | | | |
|---|---|---|---|---|
| 3,659,240 A * | 4/1972 | Learned et al. | ............... | 336/200 |
| 3,818,409 A | 6/1974 | Pastors et al. | | |
| 4,169,271 A * | 9/1979 | Saitoh | ............... | 257/529 |
| 4,626,818 A * | 12/1986 | Hilgers | ............... | 337/166 |
| 4,771,260 A * | 9/1988 | Gurevich | ............... | 337/231 |
| 4,924,203 A * | 5/1990 | Gurevich | ............... | 337/231 |
| 4,928,384 A * | 5/1990 | Gurevich | ............... | 29/623 |
| 5,097,247 A | 3/1992 | Doerrwaechter | | |
| 5,160,783 A * | 11/1992 | Nemoto et al. | ............... | 442/67 |
| 5,446,436 A * | 8/1995 | Williams | ............... | 337/273 |
| 5,712,610 A * | 1/1998 | Takeichi et al. | ............... | 337/290 |
| 5,995,351 A * | 11/1999 | Katsumata et al. | ............... | 361/105 |
| 2003/0154592 A1* | 8/2003 | Felten | ............... | 29/610.1 |
| 2005/0264394 A1* | 12/2005 | Furuuchi | ............... | 337/182 |
| 2006/0268645 A1* | 11/2006 | Graf et al. | ............... | 365/225.7 |
| 2007/0197686 A1* | 8/2007 | Dimanshteyn et al. | ........ | 523/179 |
| 2009/0278147 A1* | 11/2009 | Suzuki | ............... | 257/98 |

FOREIGN PATENT DOCUMENTS

| | | |
|---|---|---|
| CN | 201430114 Y | 3/2010 |
| EP | 0 143 493 | 6/1985 |
| JP | 5-38937 U | 5/1993 |
| JP | 7-85771 | 3/1995 |
| JP | 2007-250347 A | 9/2007 |
| WO | WO 2005/086196 A1 | 9/2005 |

* cited by examiner

*Primary Examiner* — Adrian S Wilson
*Assistant Examiner* — Abhishek Rathod
(74) *Attorney, Agent, or Firm* — Oblon, Spivak, McClelland, Maier & Neustadt, L.L.P.

(57) ABSTRACT

A printed wiring board includes an insulating resinous substrate having an aperture unit, a first terminal unit and a second terminal unit consisting of a conductor and formed on top of the resinous substrate, and a fuse unit that electrically couples the first terminal unit and the second terminal unit to each other. At least a part of the fuse unit is disposed over the aperture unit, and in addition, is covered by a porous inorganic covering material having insulating properties.

50 Claims, 24 Drawing Sheets

FIG.3
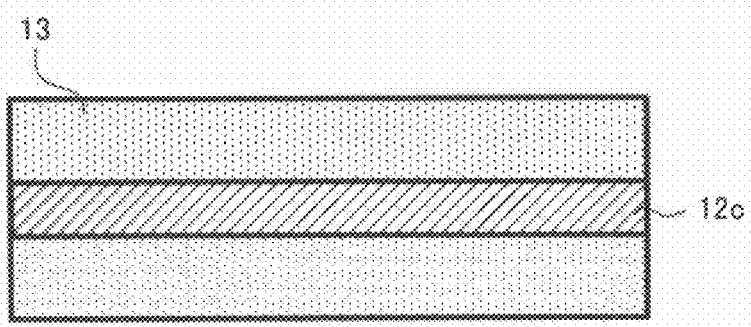
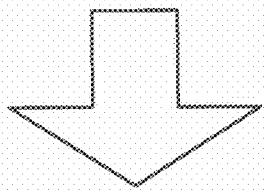
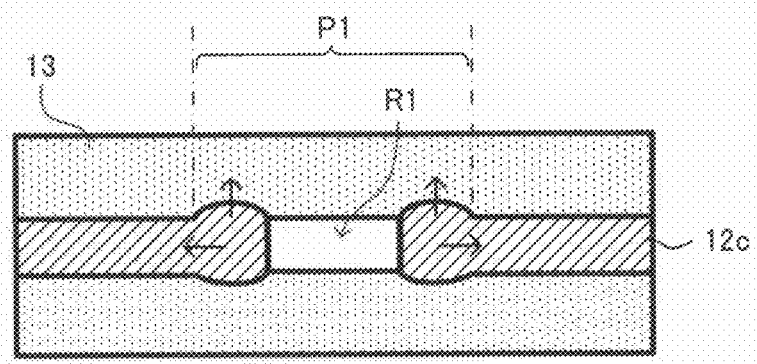

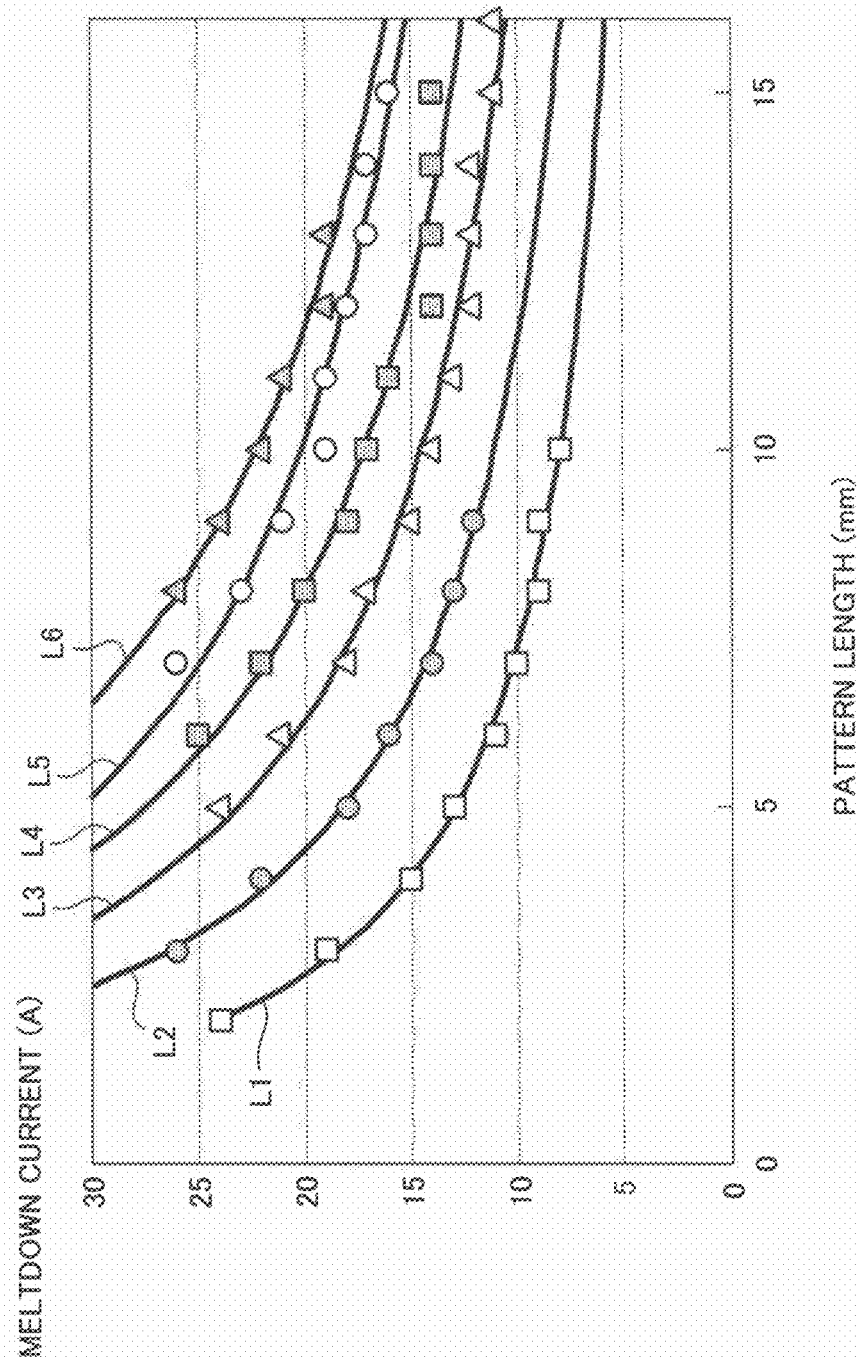

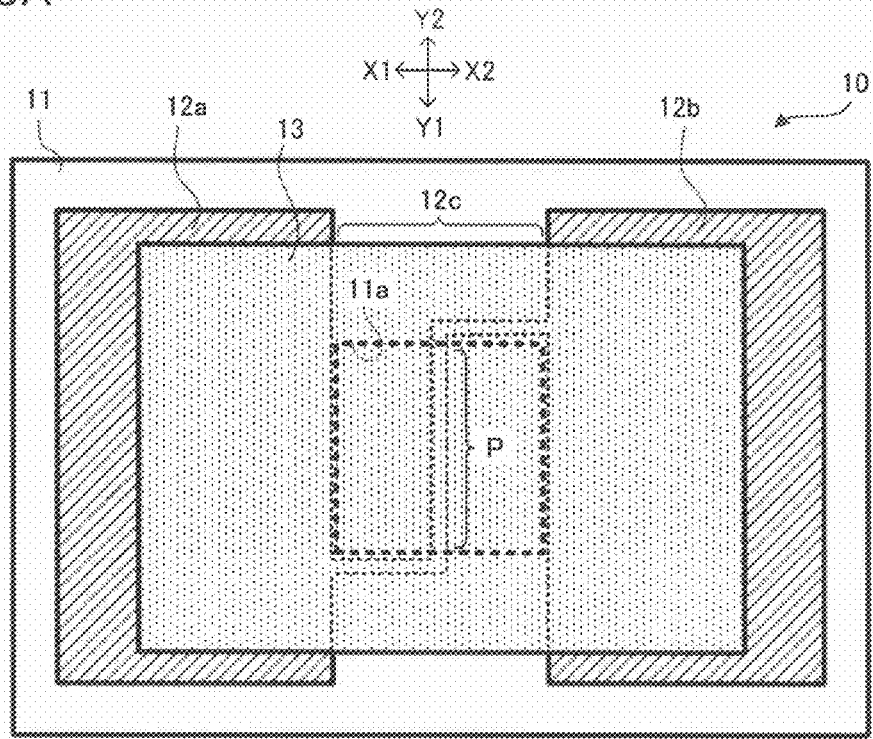
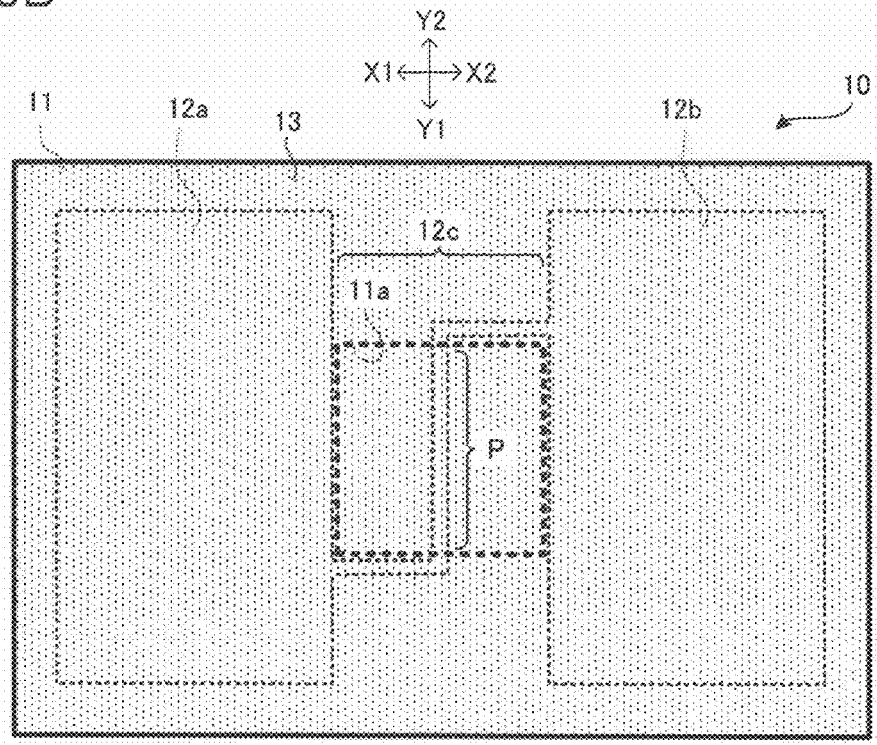

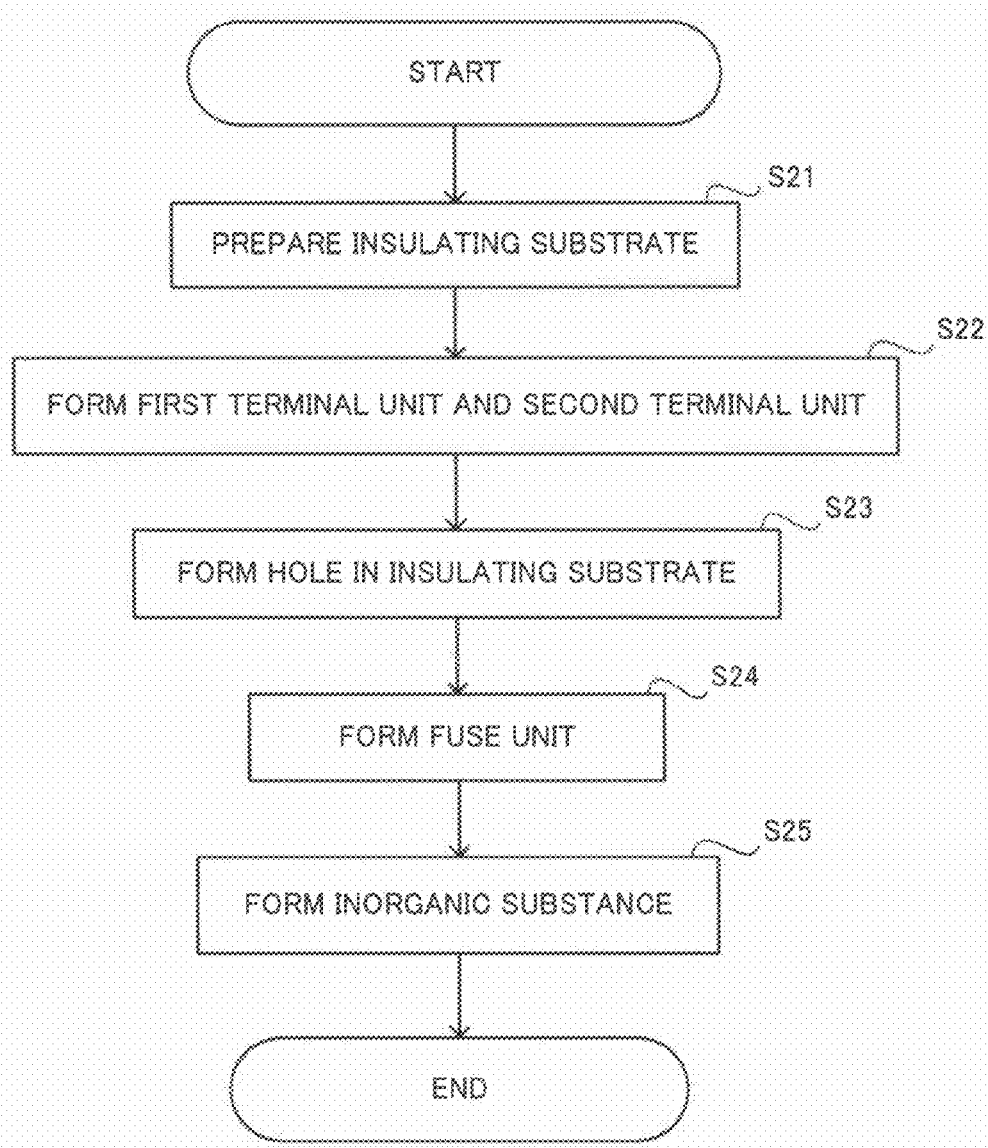

PRINTED WIRING BOARD, ELECTRONIC DEVICE, AND PRINTED WIRING BOARD MANUFACTURING METHOD

CROSS-REFERENCE TO RELATED APPLICATION

This application claims the benefit of Japanese Patent Application No. 2010-133173, filed on Jun. 10, 2010, the entire disclosure of which is incorporated by reference herein.

FIELD

This application relates to a printed wiring board, an electronic device, and a printed wiring board manufacturing method.

BACKGROUND

Realizing an electronic device by packaging electronic components on a printed wiring board is known, for example. With such electronic devices, in cases where thermal runaway or dielectric breakdown occurs, large currents flow through a circuit and the electronic device is damaged. Thus, in order to protect an electronic device, providing a fuse unit on a printed wiring board as a failsafe function has been proposed.

A printed wiring board that internally includes a fuse unit has been proposed. Unexamined Japanese Utility Model Application (Registration) Publication No. H05-38937 discloses a printed wiring board equipped with a substrate, a pair of lands formed opposite each other on either side of an aperture unit provided on the substrate, a first trace pattern respectively coupled to the pair of lands, and a second trace pattern straddling the aperture unit to couple the pair lands and formed more finely than the first trace pattern. This printed wiring board of the related art described in Unexamined Japanese Utility Model Application (Registration) Publication No. H05-38937 is provided with a fine semiconductor pattern (the second trace pattern) over the aperture unit of the substrate.

Furthermore, Unexamined Japanese Patent Application KOKAI Publication No. H07-85771 discloses a printed wiring board having, on a film substrate, a fuse unit made up of metal foil and a pair of terminal units joined to the fuse unit. In this printed wiring board of the related art described in Unexamined Japanese Patent Application KOKAI Publication No. H07-85771, the fuse unit is encapsulated in resin (organic material) in order to reduce the effects of temperatures changes or other changes in ambient environment.

The contents of Unexamined Japanese Utility Model Application (Registration) Publication No. H05-38937 and Unexamined Japanese Patent Application KOKAI Publication No. H07-85771 are incorporated into this specification.

SUMMARY OF THE INVENTION

A printed wiring board in accordance with the present invention includes an insulating resinous substrate having an aperture unit, a first terminal unit and a second terminal unit consisting of a conductor and formed on top of the resinous substrate, and a fuse unit that electrically couples the first terminal unit and the second terminal unit to each other, wherein at least a part of the fuse unit is disposed over the aperture unit, and in addition, is covered by a porous inorganic covering material having insulating properties.

An electronic device in accordance with the present invention includes a plurality of electrical components and a the printed wiring board, wherein the fuse unit is individually provided for each of the electronic components.

A printed wiring board manufacturing method in accordance with the present invention includes preparing an insulating resinous substrate, forming a first terminal unit and a second terminal unit consisting of a conductor on top of the resinous substrate, forming a fuse unit that electrically couples the first terminal unit and the second terminal unit to each other, forming an aperture unit at the fuse unit, and applying, drying, and hardening a paste that includes an inorganic binder and a ceramic filler to at least a part of the fuse unit disposed over the aperture unit, thereby covering that part with an insulating inorganic covering material.

BRIEF DESCRIPTION OF THE DRAWINGS

A more complete understanding of this application can be obtained when the following detailed description is considered in conjunction with the following drawings, in which:

FIG. 3 is a diagram illustrating how a fuse unit melts down on a printed wiring board in accordance with the present embodiment;

FIG. 5 is a graph illustrating the relationship between the design value and actual value of meltdown current for respective fuse units having different circuit cross-sectional areas;

FIG. 13A is a diagram illustrating an example wherein an inorganic covering material protrudes out over a first terminal unit and a second terminal unit in an embodiment of the present invention;

FIG. 13B is a diagram illustrating an example wherein an inorganic covering material covers the entirety of a first surface or a second surface on a printed wiring board in an embodiment of the present invention;

FIG. 20 is a flowchart illustrating an exemplary method of manufacturing the printed wiring board illustrated in FIGS. 18A and 18B;

DETAILED DESCRIPTION OF THE INVENTION

Figure 1A:
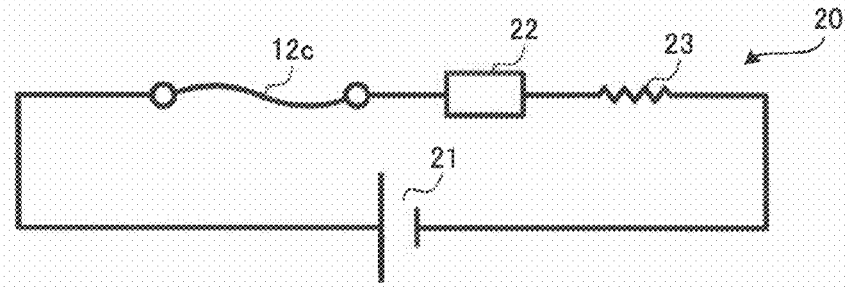
FIG. 1A is a diagram illustrating an exemplary circuit used by a printed wiring board in accordance with an embodiment of the present invention.

With a printed wiring board described in Unexamined Japanese Utility Model Application (Registration) Publication No. H05-38937 and Unexamined Japanese Patent Application KOKAI Publication No. H07-85771, it is conceivable that problems like the following may occur.

With a printed wiring board of the related art described in Unexamined Japanese Utility Model Application (Registration) Publication No. H05-38937 and Unexamined Japanese Patent Application KOKAI Publication No. H07-85771, since resin (insulating resin or encapsulating resin of the printed wiring board, for example) contacts the fuse unit, when the fuse unit burns out surrounding temperatures will rise and the resin will carbonize more readily. For example, if the temperature is raised to the melting point of copper (approximately 1000° C.) in order to fuse copper traces, glass fiber epoxy resin typically used in printed wiring boards will carbonize. Since resin loses its insulating properties if carbonized, re-electrification will occur from the carbonized portions. Moreover, once a current starts flowing, resin carbonization will advance due to heating (Joule heating) even with a current of small magnitude, and thus accelerating re-electrification will occur more readily.

Also, with the printed wiring board of the related art described in Unexamined Japanese Utility Model Application (Registration) Publication No. H05-38937, the conductor of a burnt out fuse unit becomes a large mass and scatter about its surroundings more readily. Particularly, in the case where a plurality of electronic components (semiconductor elements, for example) are disposed in series and in parallel, other electronic components will remain charged even if a single semiconductor element is isolated by a fuse unit coupled thereto. This can easily lead to failure if another electronic component is shorted due to scattering of conductor mass.

Such re-electrification and shorting as above can conceivably become a factor in the damage or destruction of an electronic device.

In an embodiment of the present invention, it becomes possible to obtain a printed wiring board, an electronic device, and a printed wiring board manufacturing method in which it is possible to reliably isolate an electrical circuit when a fuse unit burns out.

Hereinafter, an embodiment of the present invention will be explained in detail and with reference to the drawings. Herein, the arrows Z1 and Z2 in the drawings respectively refer to the normal direction (or the board thickness direction) of the principal surfaces (front/back surface) of the board. Meanwhile, the arrows X1, X2 and Y1, Y2 respectively refer to directions orthogonal to the Z direction (directions parallel to the principal surfaces of the board). The principal surfaces of the board become X-Y planes, and the sides of the board become X-Z planes or Y-Z planes.

Regarding an aperture unit on a printed wiring board (a hole that does not penetrate the printed wiring board, or a hole that does penetrate the printed wiring board, for example), a cross-section orthogonal to the Z direction (the X-Y plane) is called a horizontal cross-section. Also, a cross-section parallel to the Z direction (the X-Z plane or the Y-Z plane) is called a vertical cross-section.

In the present embodiment, the two principal surfaces with opposing normal directions are called the first surface (the Z1 surface) and the second surface (the Z2 surface). In other words, the principal surface on the opposite side of the first surface is the second surface, and the principal surface on the opposite side of the second surface is the first surface.

Layers including conductor patterns that function as circuits or other patterns (including grounds) formed on a printed wiring board, as well as layers made up only of solid patterns, are called conductor layers. An aperture unit of a printed wiring board is taken to include holes or grooves, as well as notches or cuts, etc. A hole is not limited to a penetrating hole, and herein a hole also refers to non-penetrating holes, and is also taken to include via holes and through holes.

Regarding the front and back surfaces of a printed wiring board or a line pattern formed on an inner-layer surface (such as traces on the surface or grooves below the surface), for the directions orthogonal to the line pattern, the measure of the direction parallel to the formation surface is called the "width", and the measure of the direction orthogonal to the formation surface is called the "height", "thickness", or "depth". Also, the end-to-end measure of a line pattern is called the "length". However, the above is not limiting in the case where other measures are clearly being referred to.

FIG. 1A illustrates an exemplary circuit (circuit 20) provided on a printed wiring board 10 (particularly a fuse unit 12c) in accordance with an embodiment of the present invention. The circuit 20 is a circuit formed on a printed wiring board 10 in accordance with the present embodiment, and FIG. 1A illustrates the circuit 20 in conjunction with an electronic component 22 packaged on the printed wiring board 10.

Figure 1B:
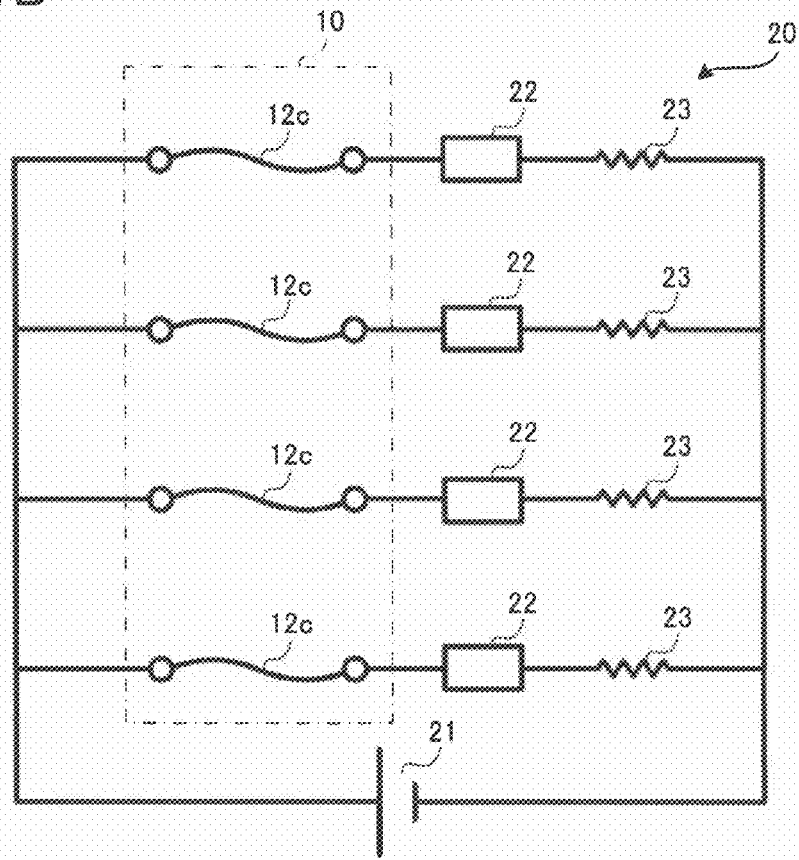
FIG. 1B is a diagram illustrating a first alternative example of a circuit used by a printed wiring board in accordance with an embodiment of the present invention.
Figure 1C:
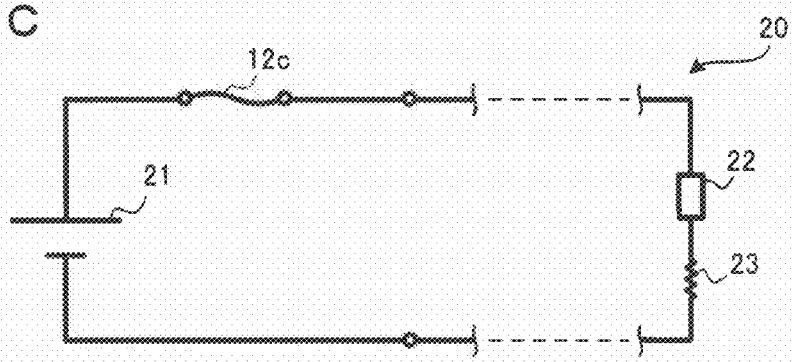
FIG. 1C is a diagram illustrating a second alternative example of a circuit used by a printed wiring board in accordance with an embodiment of the present invention.

As illustrated in FIG. 1A, in the circuit 20, the fuse unit 12c of the printed wiring board 10 (see FIG. 2A) is coupled in series with a power source 21 and an electronic component 22, for example. Also, the power source 21 and the electronic component 22 are electrically coupled to each other via a load 23. However, the above is not limiting, and as illustrated in FIG. 1B for example, the circuit 20 may also be a circuit wherein a plurality of loads 23 are coupled in parallel, with an electronic component 22 and a fuse unit 12c coupled in series to each load 23. In the circuit 20 illustrated in FIG. 1B, a plurality of fuse units 12c are provided for a single circuit 20. Also, as illustrated in FIG. 1C, the circuit 20 may also be a circuit wherein an electronic component 22 and a load 23 are separately (externally) provided. Typically, with a storage battery, a structure with such an externally provided electronic component is taken. In FIGS. 1A and 1B, a resistor is illustrated as the load 23, but the load 23 may be any component that consumes electricity, such as a lamp or other component besides a resistor. The circuit 20 illustrated in FIGS. 1A, 1B, and 1C constitutes an electronic device.

The electronic component 22 is a semiconductor element, for example. However, the electronic component 22 is not necessarily a semiconductor element, and the type of the electronic component 22 is arbitrary. For example, an active component such as an IC circuit, or a passive component such as a capacitor, resistor, or coil may be adopted as the electronic component 22.

Figure 2A:
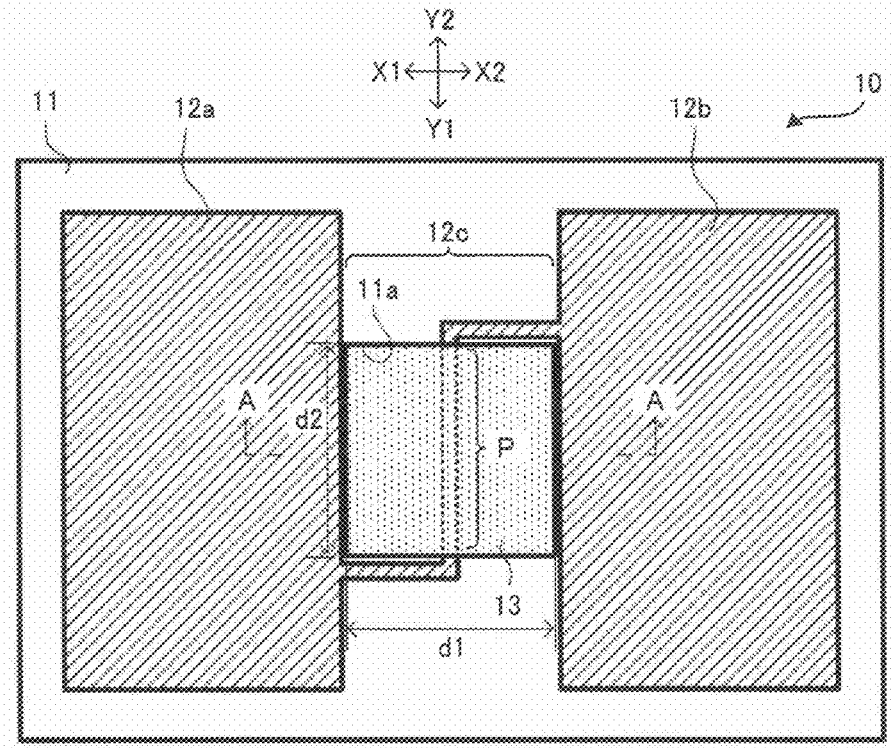
FIG. 2A is a plan view illustrating a printed wiring board in accordance with an embodiment of the present invention.
Figure 2B:
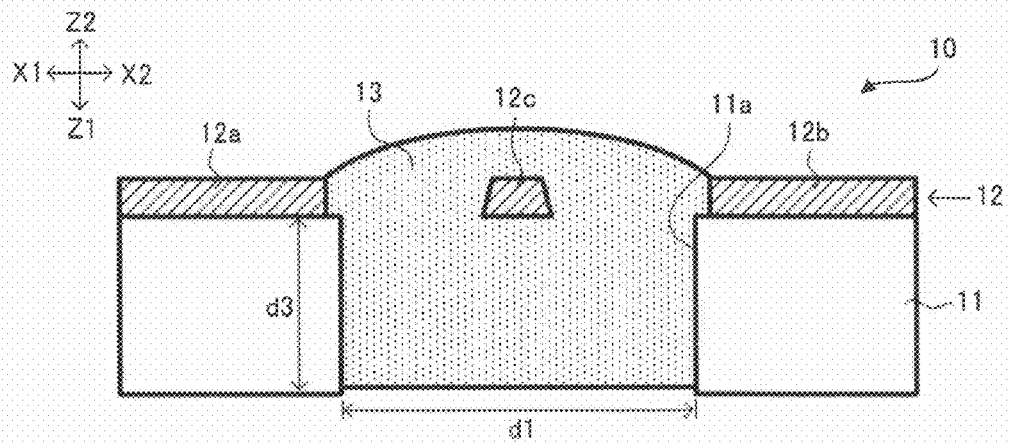
FIG. 2B is a cross-section along A-A in FIG. 2A.

As illustrated in FIGS. 2A and 2B (a cross-section along A-A in FIG. 2A), the printed wiring board 10 includes a resinous substrate 11 and a conductor layer 12. The printed wiring board 10 of the present embodiment is made up of a circuit conductor layer 12 illustrated in FIGS. 2A and 2B, but other circuits may also be included in the conductor layer 12.

Herein, the electronic component 22 (see FIGS. 1A and 1B) may also be packaged onto the printed wiring board 10. With such a structure, it becomes possible to form the printed wiring board 10 adjacent to the electronic component 22, and thus it is conceivable that the packaging density could be raised more easily. As a result, it is conceivable that obtaining a compact electronic device is possible.

The resinous substrate 11 has insulating properties, and forms the core substrate of the printed wiring board 10. However, the above is not limiting, and the resinous substrate 11 may also be taken to be an interlayer insulation layer of the printed wiring board 10.

The resinous substrate 11 is made up of an epoxy resin, for example. The epoxy resin preferably includes a stiffener such as glass fiber or aramid fiber, paper, glass cloth, silica filler, or glass filler by a resin impregnation process, for example. The stiffener is a material with a smaller coefficient of thermal expansion than the principal material (the epoxy resin), preferably an inorganic material such as glass fiber, glass cloth, silica filler, or glass filler, for example, and more preferably a fibrous inorganic material such as glass fiber or glass cloth. If the stiffener is made up of inorganic material (inorganic filler), it becomes easier to bring the coefficient of thermal expansion for an inorganic covering material 13 and the coefficient of thermal expansion for the resinous substrate 11 closer together, thereby making it easier to prevent peeling due to heat cycling. Furthermore, if a stiffener made up of an inorganic material is used, it becomes easier to increase the wetness of the inorganic covering material 13 in paste form, and thus adhesion strength with the inorganic covering material 13 can be strengthened more easily. Furthermore, if the stiffener is made up of a fibrous inorganic material, then as discussed later, the resinous substrate 11 and the inorganic covering material 13 can be more easily coupled on the sides of a hole 11a (aperture unit). In the present embodiment, a resinous substrate 11 made up of an epoxy resin impregnated with glass cloth (hereinafter called glass epoxy) is taken to be used. However, the above is not limiting, and a resin such as a polyester resin, Bismaleimide-Triazine resin (BT resin), imide resin (polyimide), phenol resin, or allyl-containing phenylene ether resin (A-PPE resin) impregnated with paper, glass fiber, or aramid fiber, etc. may also be used as the material of the resinous substrate 11, for example. Furthermore, the shape, thickness, material, etc. of the resinous substrate 11 is basically arbitrary.

A hole 11a (aperture unit) is formed in the resinous substrate 11. In the present embodiment, the case of the hole 11a being a penetrating hole is given by example, but the hole 11a may be a penetrating hole or a non-penetrating hole (see FIG. 29 discussed later). Also, the shape of the hole 11a may be any shape. The shape of the hole 11a in the present embodiment is that of an approximate quadrangular prism, for example, and the cross-sectional surface (X-Y plane) of the hole 11a is an approximately rectangle approximately 2 mm×approximately 10 mm. Specifically, in FIGS. 2A and 2B, the measure d1 in the X direction is approximately 2 mm and the measure d2 in the Y direction is approximately 10 mm, for example. The depth (the measure d3 in the Z direction) of the hole 11a is approximately 200 μm. In the present embodiment, an aperture unit is taken to be the hole 11a, but may also be taken to be another aperture unit such as a groove, notch, or cut.

A conductor layer 12 is formed on the resinous substrate 11 (on the second surface, for example). The conductor layer 12 includes a first terminal unit 12a, a second terminal unit 12b, and a fuse unit 12c. In the present embodiment, the first terminal unit 12a, the second terminal unit 12b, and the fuse unit 12c are continuously and integrally formed. However, the above is not limiting, and for example the fuse unit 12c, etc. may be separately formed, with either end of the fuse unit 12c later joined to the first terminal unit 12a and the second terminal unit 12b, respectively (see FIGS. 18A to 22B discussed later).

The conductor layer 12 is made of copper. However, this is not limiting, and the material of the conductor layer 12 is arbitrary. Also, although a case where the material of the fuse unit 12c and the material of the first terminal unit 12a and second terminal unit 12b are approximately the same is given by example in the present embodiment, their materials may be approximately the same or they may differ.

The thickness of the resinous substrate 11 is approximately 0.2 mm, for example, and the thickness of the conductor layer 12 is approximately 105 μm, for example. The conductor width of the fuse unit 12c is in the range from approximately 0.2 mm to approximately 0.5 mm, for example, and the conductor length of the fuse unit 12c is in the range from approximately 2 mm to approximately 15 mm, for example.

The first terminal unit 12a and the second terminal unit 12b are disposed on either end of the fuse unit 12c. The fuse unit 12c is installed between the first terminal unit 12a and the second terminal unit 12b, and is mutually coupled to the first terminal unit 12a and the second terminal unit 12b. Additionally, a part of the fuse unit 12c (a hanging part P) is disposed over the hole 11a and is covered by an insulating inorganic covering material 13. Herein, the inorganic covering material 13 is a porous insulator.

The porosity of the inorganic covering material 13 is preferably from approximately 10% to approximately 40%. This is because in the case where the porosity of the inorganic covering material 13 is approximately 10% or more, gaps form less readily even if the fuse unit 12c melts, and it becomes easier to isolate current. In the case where the porosity of the inorganic covering material 13 is approximately 40% or less, the inorganic covering material 13 becomes brittle less readily, and the inorganic covering material 13 becomes damaged less readily.

The porosity of the inorganic covering material 13 can be adjusted as appropriate according to the solvent concentration or drying temperature, etc. of the insulating paste used to form the porous inorganic covering material 13. For example, if the paste has a high solvent concentration and is slowly dried at a low temperature, the porosity of the inorganic covering material 13 decreases more readily, whereas if the paste has a low solvent concentration and is quickly dried at a high temperature, the porosity of the inorganic covering material 13 increases more readily.

The inorganic covering material 13 fills the hole 11a and covers the hanging part P of the fuse unit 12c. As a result, the hanging part P is encapsulated, and it becomes easier to prevent a melted fuse unit 12c from scattering about its surroundings.

In the present embodiment, the part that fills the hole 11a (the inorganic covering material 13) and the part that covers the hanging part P (the inorganic covering material 13) are integrally formed, but this is not limiting, and for example an insulating paste or inorganic solid substance used to form the porous inorganic covering material 13 may be first packed into the hole 11a, and then the fuse unit 12c may be formed over the insulating paste or inorganic solid substance, and the fuse unit 12c may be covered with an insulating film, etc. (see FIGS. 23 to 25B discussed later). In this case, the insulating film need not be porous, but since arc-suppressing effects are easily obtained by the formation of a gap as discussed later if the insulating film is porous, it is desirable for an insulating film to be porous. The inorganic covering material 13 may also protrude out from the hole 11a on the first surface or the second surface (see FIGS. 13A and 13B discussed later).

The inorganic covering material 13 may be any material as long as it is porous, and may be entirely porous throughout or porous only in the portion contacting the fuse unit 12c. The inorganic covering material 13 of the present embodiment is made up of an insulating paste. However, this is not limiting, and may also be an inorganic covering material 13 that includes an insulating film such as mica, for example (see FIGS. 25A and 25B discussed later).

The inorganic covering material 13 is preferably made up of an insulating paste including an inorganic binder and a ceramic filler. If the inorganic covering material 13 is an insulating paste including an inorganic binder and a ceramic filler, only the inorganic binder contracts during the drying and hardening process, and thus a porous inorganic covering material 13 can be obtained more easily.

The inorganic binder is preferably made up of at least one from among soluble silicate, hardened ceramic sol, sepiolite, and attapulgite. Among these, the inorganic binder is preferably made up of soluble silicate (water glass, for example) or ceramic sol. By drying soluble silicate or sol, the inorganic covering material 13 can be made to adhere to the adherend (such as the resinous substrate 11) more readily, and the inorganic covering material 13 conceivably becomes resistant to peeling even if subjected to heat cycling or vibration. Also, since soluble silicate is an inorganic material with excellent heat resistance, by using soluble silicate as the principal ingredient of the inorganic covering material 13 the inorganic covering material 13 becomes resistant to deterioration or decomposition under high-temperature conditions. Thus, even if the fuse unit 12c melts down and the inorganic covering material 13 is exposed to high temperatures, the inorganic covering material 13 conceivably becomes able to maintain its shape and insulating properties more easily.

The above soluble silicate for the inorganic binder is preferably water glass with sodium silicate as its principal ingredient. Water glass is obtained by dissolving sodium silicate in water and applying heat. Water glass is equivalent to a thermosetting inorganic adhesive material. By granting the inorganic covering material 13 adhesive properties, it is conceivable that the hanging part P of the fuse unit 12c will be reliably covered by the inorganic covering material 13. However, the above is not limiting, and the soluble silicate may also be a soluble silicate other than sodium silicate, such as calcium silicate, for example.

The above ceramic sol for the inorganic binder is preferably at least one from among alumina sol, silica sol, and titania sol, for example.

The inorganic covering material 13 can be formed by applying the above insulating paste (aqueous solution, for example) to the resinous substrate 11 and drying, for example. Furthermore, according to such a formation method, encapsulation becomes strong, and the inorganic covering material 13 becomes resistant to peeling due to heat cycling or vibration applied to the resinous substrate 11.

The ceramic filler is preferably particulate, powdered, or fibrous, such as ceramic powder, ceramic granules, or ceramic fibers. The ceramic filler is preferably made up of at least one from among a glass material, alumina, zirconia, silica, and silicon carbide. Since ceramic is an inorganic material with excellent heat resistance, by incorporating ceramic into the inorganic covering material 13 the inorganic covering material 13 becomes resistant to deterioration or decomposition under high-temperature conditions. Thus, even if the fuse unit 12c melts down and the inorganic covering material 13 is exposed to high temperatures, the inorganic covering material 13 is conceivably becomes able to maintain its shape and insulating properties more easily.

Preferably, the inorganic covering material 13 is chemically stable at the melting point of the fuse unit 12c. For example, in the case where the fuse unit 12c is copper, it is preferable for the inorganic covering material 13 to be chemically stable at approximately 1080° C. In so doing, the inorganic covering material 13 becomes resistant to degradation or destruction even if the temperature of the fuse unit 12c rises to the melting point when melting down. Being chemically stable is herein taken to mean not oxidizing or decomposing at a given temperature, and does not include softening.

More specifically, Aron Ceramic (registered trademark) made by Toagosei, Ceramabond 835 (registered trademark) made by Audec, Betack (registered trademark) made by TA Chemical, Resbond (registered trademark) made by Taiyo Wire Cloth, Niccera Coat (registered trademark) made by Hagi Glass, or Sumiceram (registered trademark) made by Asahi Chemical, etc. may be used as the inorganic covering material 13, for example. All of the above have water glass as their principal ingredient. Aron Ceramic primarily includes silica and zirconia, has an upper temperature limit of approximately 1100° C., and its CTE (coefficient of thermal expansion) is approximately 4, 8, or approximately 13 ppm/° C. Ceramabond 835 primarily includes zirconia, and its upper temperature limit is approximately 1650° C. Betack primarily includes silica and alumina, and its upper temperature limit is approximately 1550° C. Resbond primarily includes alumina and zirconia, has an upper temperature limit of approximately 1640° C., and its CTE is approximately 8 ppm/° C. Niccera Coat primarily includes alumina and zirconia, has an upper temperature limit of approximately 1800° C., and its CTE is approximately 8 ppm/° C. Sumiceram primarily includes alumina and zirconia, has an upper temperature limit of approximately 1600° C., and its CTE is approximately 7 ppm/° C. Herein, the upper temperature limit indicates that there is oxidation, decomposition, or softening at that temperature, and it can be said that each material is chemically stable at least at its upper temperature limit. These inorganic covering materials 13 are water-containing pastes during the manufacturing process, but become porous ceramics once dried and hardened.

Preferably, resin has been removed from the interior surface of the hole 11a. Resin on the interior surface of the hole 11a may be removed using any method, but if for example permanganic acid, chromic acid, sulfuric acid, or their salts are used, just organic matter can be selectively removed. As a result, the glass fiber or other stiffener is not oxidized, but the resin is oxidized and an uneven surface is formed. Particularly, the ends of fibers are exposed at the surface in the case where the resinous substrate 11 includes a fibrous inorganic stiffener. In so doing, the resinous substrate 11 and the inorganic covering material 13 can be coupled more easily and it becomes easier to raise the adhesive strength.

The coefficient of thermal expansion for a resinous substrate 11 including glass fiber (stiffener) is approximately 10 to approximately 15 ppm/° C. in the planar direction and approximately 60 ppm/° C. in the thickness direction, whereas the coefficient of thermal expansion for the inorganic covering material 13 is approximately 5 to approximately 15 ppm/° C. in both the planar direction and the thickness direction. For this reason, inorganic covering material 13 contacting the sides of the resinous substrate 11 easily peels due to the thermal expansion differential. However, if the ends of a fibrous stiffener are exposed it becomes easier to obtain a strong adhesive strength, and thus the inorganic covering material 13 becomes resistant to peeling.

The inorganic covering material 13 preferably has a coefficient of thermal expansion approximately equal to the fuse unit 12c. For example, in the case where the fuse unit 12c is formed out of copper, since the coefficient of thermal expansion for copper is approximately 17 ppm/° C., the coefficient of thermal expansion for the inorganic covering material 13 is preferably in the range from approximately 10 to approximately 25 ppm/° C.

As above, in the present embodiment, the hanging part P of a fuse unit 12c is covered in an inorganic covering material 13. Additionally, the inorganic covering material 13 is made up of materials resistant to decomposition even at high temperatures. For this reason, the inorganic covering material 13 does not readily decompose around the fuse unit 12c even if high temperatures are reached when the fuse unit 12c melts down, and thus the insulating properties of the inorganic covering material 13 are easily maintained. As a result, it conceivably becomes easier to reliably isolate a circuit when the fuse unit 12c melts down.

In the present embodiment, the hanging part P of the fuse unit 12c is positioned over the hole 11a and does not contact the resinous substrate 11. For this reason, organic substances (such as resin) included in the resinous substrate 11 do not readily oxidize even in the case where the fuse unit 12c melts down. Thus, the insulating properties of the resinous substrate 11 are more easily maintained.

Since the he hanging part P of the fuse unit 12c is covered by the insulating inorganic covering material 13, the conductor material of the fuse unit 12c becomes less likely to scatter about its surroundings even if the fuse unit 12c melts down. Thus, it becomes easier to prevent shorting exposed resistors or other charged units on the periphery of the printed wiring board 10.

Figure 4A:
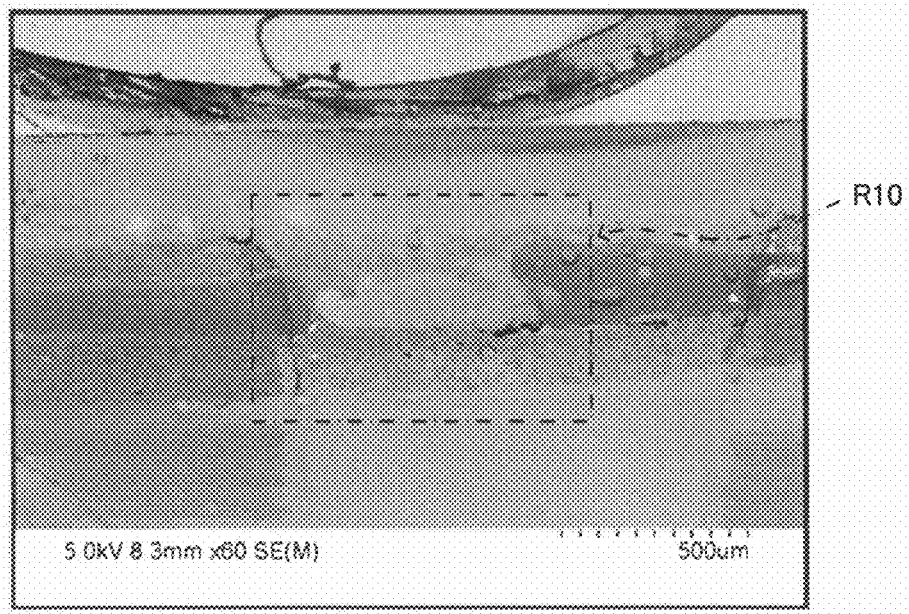
FIG. 4A is an SEM (Scanning Electron Microscope) photograph illustrating how a fuse unit melts down on a printed wiring board in accordance with the present embodiment.
Figure 4B:
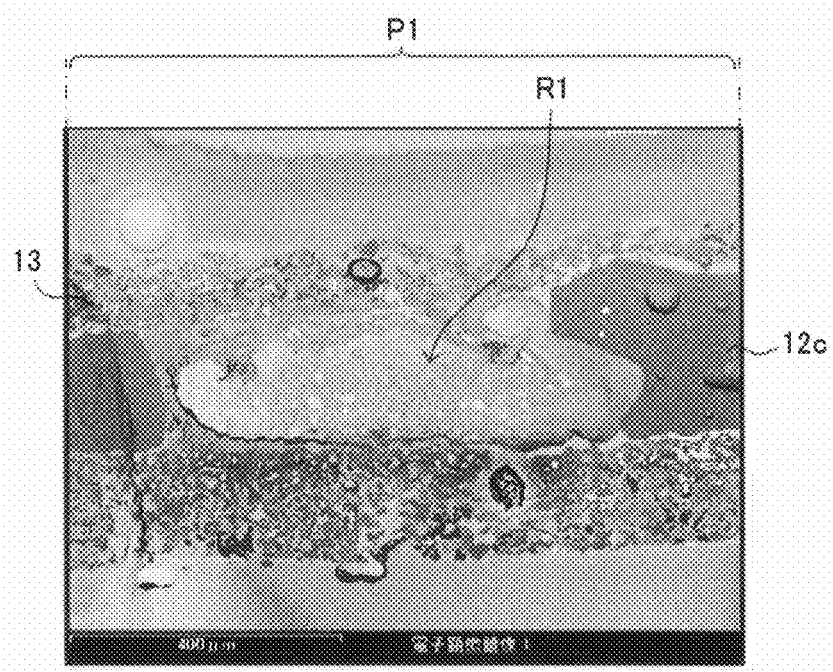
FIG. 4B is an enlarged photograph of a partial area in FIG. 4A.

FIG. 3 illustrates how the fuse unit 12c melts down on a printed wiring board in accordance with the present embodiment. More specifically, as illustrated in FIG. 3, if the fuse unit 12c melts down, a gap R1 is formed in the meltdown part P1, thereby severing the fuse unit 12c and interrupting current flow. The conductor of the fuse unit 12c in the meltdown part P1 is pulled away from the gap R1, forces act in directions that expand the inorganic covering material 13, and since the conductor of the fuse unit 12c is still covered by the inorganic covering material 13, it is conceivable that scattering will be prevented. FIGS. 4A and 4B (an enlarged photograph of the region R10 in FIG. 4A) illustrate cross-sectional SEM photographs of the meltdown part P1. Although copper (the conductor material constituting the fuse unit 12c) exists on the lateral walls of the fuse unit 12c in the meltdown part P1 after meltdown, copper does not exist inside the inorganic covering material 13, and traces of vaporized copper permeating into the interior of the inorganic covering material 13 were not confirmed from the photographs in FIGS. 4A and 4B or from results of copper area analysis. Given these findings, it is conceivable that the porous ceramic constituting the inorganic covering material 13 will absorb the deformation of the conductor of the fuse unit 12c at meltdown and more readily suppress effects on external features. Herein, Aron Ceramic discussed earlier was used as the inorganic covering material 13 in the above analysis, but it is conceivable that similar results will be obtained even the case where the inorganic covering material 13 includes other ceramics.

Also, in the case where the inorganic covering material 13 is a porous sealant with ceramic particles encased in water glass, the sealant ordinarily surrounds and supports the fuse unit 12c, thus preventing mechanical damage due to vibrations, foreign substances, etc. Also, when the fuse unit 12c melts down, molten copper dissolves the water glass. By dissolving the water glass, porous cavities are destroyed, the sealant undergoes volume shrinkage, and the copper fills up the porous cavities. For this reason, it is conceivable that a gap will be formed in the fuse unit 12c. More specifically, it is conceivable that the severed portion will become hollow and a gap will be created. For this reason, it is conceivable that such a inorganic covering material 13 has arc-suppressing effects, and with arc-suppressing effects it is conceivable that current can be swiftly and reliably terminated. In the present embodiment, arc-suppressing effects refer to effects that terminate arc discharge occurring between conductors of a severed fuse unit 12c.

In the present embodiment, since the inorganic covering material 13 includes an inorganic binder, the fuse unit 12c more readily becomes firmly held by the inorganic covering material 13. As a result, even in cases where the printed wiring board 10 is used in an automobile or industrial equipment with fierce vibrations, the fuse unit 12c is more readily held firmly by the inorganic covering material 13 and thus becomes resistant to breakage.

The fuse unit 12c has a finer shape than that of the first terminal unit 12a and the second terminal unit 12b. For this reason, the mechanical strength of the fuse unit 12c is smaller than that of the first terminal unit 12a and the second terminal unit 12b. Also, since the circuit cross-sectional area decreases with a finer fuse unit 12c, the resistance per unit length of the fuse unit 12c becomes greater than that of the first terminal unit 12a and the second terminal unit 12b. In other words, the fuse unit 12c heats more readily and is less strong than the first terminal unit 12a and the second terminal unit 12b. As a result, the fuse unit 12c will melt down due to current as designed in the case where an abnormal current flows through the circuit 20 illustrated in the earlier FIG. 1A.

Herein, the magnitude of the resistance can be adjusted by for example selecting the circuit cross-sectional area, material properties, etc. Resistance increases as the circuit cross-sectional area decreases, and resistance also increases by choosing materials with large resistivity. For example, as illustrated in FIG. 2B, the cross-sectional shape (X-Z cross-section) of the fuse unit 12c in the present embodiment is an approximate trapezoid. In so doing, it conceivably becomes easier to decrease the circuit cross-sectional area farther than an approximate rectangular cross-section. However, the above is not limiting, and the circuit cross-sectional area may also be adjusted with the cross-sectional thickness of the fuse unit 12c (see FIG. 14 discussed later). Also, the cross-sectional shape (X-Z cross-section) of the fuse unit 12c is not limited to an approximate trapezoid and is arbitrary (see FIG. 15 discussed later). Also, in order for the hanging part P to melt down more reliably, it is preferable to increase the resistance of the hanging part P past that of surrounding elements (see FIGS. 16A to 17B discussed later).

FIG. 5 is a graph illustrating the relationship between the design value and actual value of current at meltdown (meltdown current) for respective fuse units 12c having different circuit cross-sectional areas. In the graph in FIG. 5, meltdown current (A) takes the vertical axis and pattern length (mm) of the fuse unit 12c takes the horizontal axis. The graph in FIG. 5 illustrates respective meltdown current design values for fuse units 12c having a circuit cross-sectional area of 0.040 mm$^2$ (the line L1), 0.035 mm$^2$ (the line L2), 0.030 mm$^2$ (the line L3), 0.025 mm$^2$ (the line L4), 0.020 mm$^2$ (the line L5), and 0.014 mm$^2$ (the line L6). Meanwhile, the plotted data are actual values.

As illustrated by the graph in FIG. 5, design values and actual values for the meltdown current nearly match for circuit cross-sectional areas in the range from approximately 0.014 to approximately 0.040 mm$^2$. In other words, the fuse unit 12c will melt down at a current generally as designed. Herein, Aron Ceramic discussed earlier is taken to be the inorganic covering material 13 in the graph in FIG. 5, but it is conceivable that the trend will generally be similar for other inorganic materials.

Figure 6:
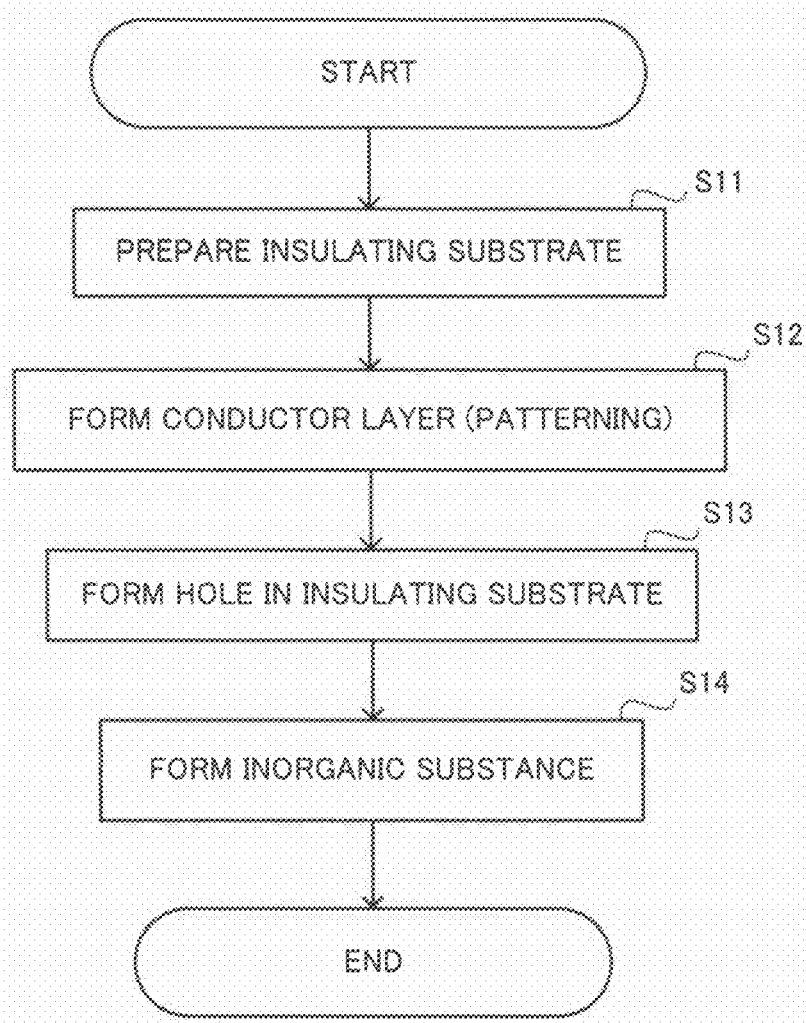
FIG. 6 is a flowchart illustrating an exemplary printed wiring board manufacturing method in accordance with an embodiment of the present invention.

A printed wiring board 10 is manufactured by a sequence like that illustrated in FIG. 6, for example. FIG. 6 is a flowchart illustrating an exemplary method of manufacturing a printed wiring board 10 in accordance with the present embodiment. FIGS. 7 to 11 are diagrams for explaining respective steps in a method of manufacturing a printed wiring board 10 in accordance with the present embodiment.

Figure 7:
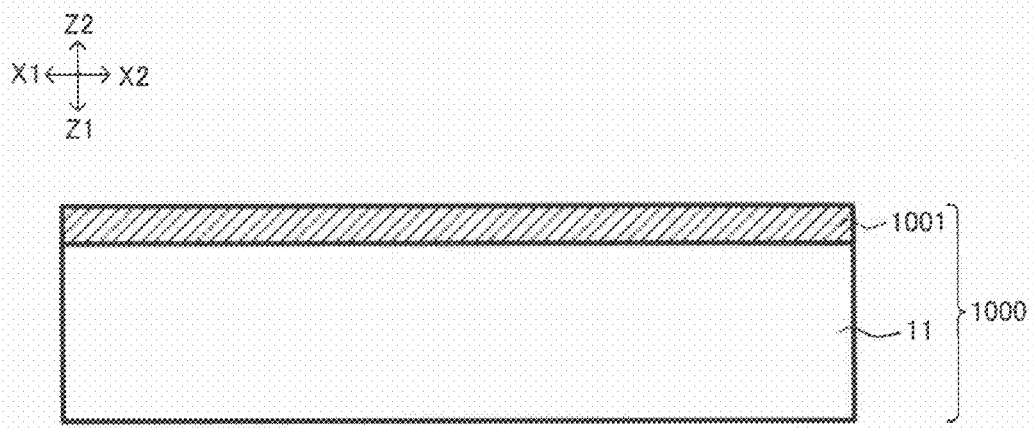
FIG. 7 is a diagram for explaining a first step of the manufacturing method in FIG. 6.

First, in step S11, a resinous substrate 11 is prepared. For example, as illustrated in FIG. 7, a single-sided copper clad laminate 1000 in which copper foil 1001 is formed on one side of the resinous substrate 11 (the second surface, for example) is taken to be a starting material. The material of the resinous substrate 11 is glass epoxy (glass-epoxy resin).

Figure 8:
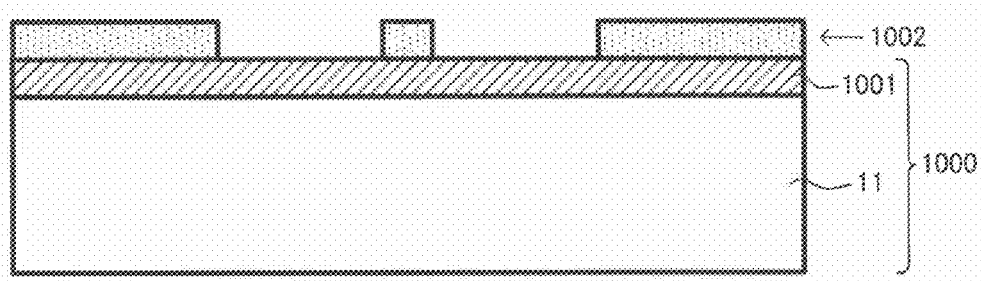
FIG. 8 is a diagram for explaining a second step after the step in FIG. 7.
Figure 9:
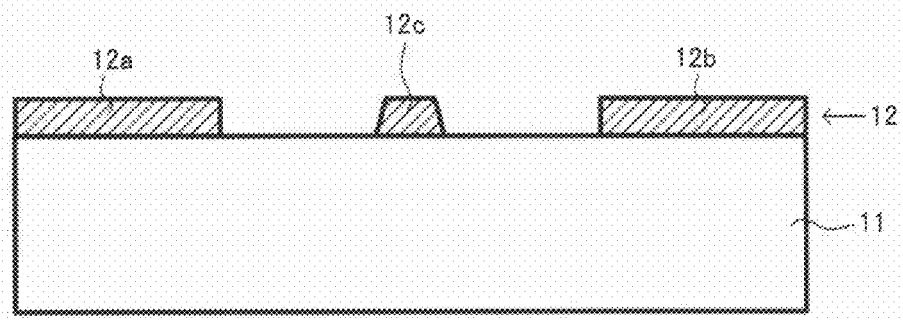
FIG. 9 is a diagram for explaining a third step after the step in FIG. 8.

Subsequently, in step S12 in FIG. 6, a conductor layer 12 is formed on the resinous substrate 11. A typical method in the field of printed wiring boards, for example, can be used as the conductor layer 12 formation technique. More specifically, as illustrated in FIG. 8 for example, resist 1002 having a pattern corresponding to a first terminal unit 12a, a second terminal unit 12b, and a fuse unit 12c is printed on the copper foil 1001 (conductor film) of the single-sided copper clad laminate 1000. Subsequently, as illustrated in FIG. 9 for example, the parts of the copper foil 1001 where the resist 1002 is not formed are etched. In so doing, the first terminal unit 12a, the second terminal unit 12b, and the fuse unit 12c are formed. The fuse unit 12c is mutually electrically coupled to the first terminal unit 12a and the second terminal unit 12b. In this way, in the present embodiment, by patterning a conductor film after forming the conductor film on the resinous substrate 11, forming the first terminal unit 12a and second terminal unit 12b as well as forming the fuse unit 12c are performed contemporaneously. Since patterning and fuse unit 12c formation are conducted contemporaneously, manufacturing efficiency is favorable. However, the conductor layer 12 formation method is arbitrary. For example, a resinous substrate 11 not having copper foil 1001 may be taken as a starting material, and then copper foil 1001 may be formed on the resinous substrate 11 by lamination, etc. Also, a copper plate coating may also be formed on the resinous substrate 11 or on the copper foil 1001 by plating.

Figure 10:
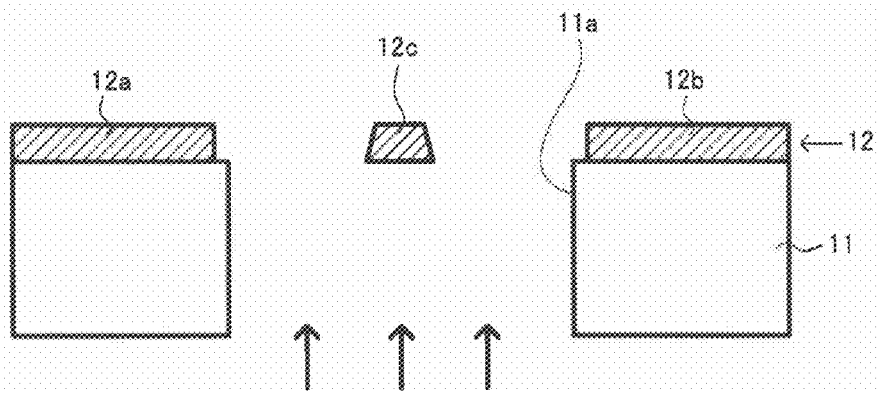
FIG. 10 is a diagram for explaining a fourth step after the step in FIG. 9.

Subsequently, in step S13 in FIG. 6, a hole 11a is formed in the resinous substrate 11. As illustrated in FIG. 10 for example, a hole 11a penetrating the resinous substrate 11 is formed from the first surface of the resinous substrate 11. In so doing, the first terminal unit 12a and the second terminal unit 12b are positioned around the hole 11a, and the fuse unit 12c is made to hang between the first terminal unit 12a and the second terminal unit 12b. A hanging part P (FIG. 2A) is positioned over the hole 11a. The hole 11a can be formed in an approximate quadrangular prism shape by radiating a laser (a $CO_2$ laser, for example) from the first surface side of the resinous substrate 11, for example. After that, permanganic acid, etc. is used as necessary to remove resin on the interior surface of the hole 11a and expose inorganic stiffener. However, the above is not limiting, and the hole 11a formation method is arbitrary.

Subsequently, in step S14 in FIG. 6, an inorganic covering material 13 is formed.

Figure 11:
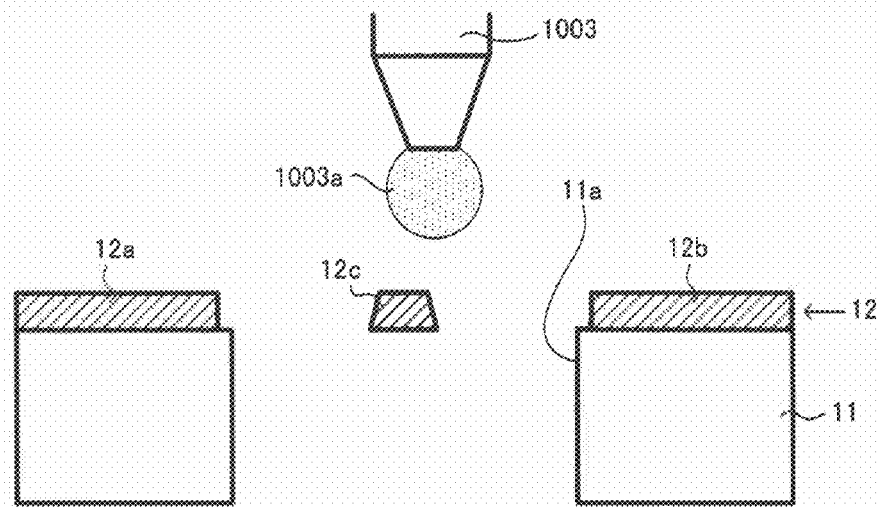
FIG. 11 is a diagram for explaining a fifth step after the step in FIG. 10.

More specifically, as illustrated in FIG. 11, an insulating paste 1003a including an inorganic binder and ceramic filler is applied to the part (the hanging part P) of the fuse unit 12c positioned over the hole 11a (the aperture unit) from the second surface side of the resinous substrate 11 by a dispenser 1003, for example. In so doing, the hole 11a is filled with the insulating paste 1003a (see the inorganic covering material 13 in FIGS. 2A and 2B).

Subsequently, the applied insulating paste 1003a is dried and hardened. For example, in the case of using Aron Ceramic as the insulating paste 1003a, the applied insulating paste 1003a is kept at room temperature for approximately 16 to approximately 24 hours, then heated to approximately 150° C. and kept at this temperature for approximately one hour. Also, in the case of using Ceramabond 835 as the insulating paste 1003a, for example, the applied insulating paste 1003a is kept at approximately 100° C. for approximately 0.5 hours, then heated to approximately 200° C. and kept at this temperature for approximately 0.5 hours. Also, in the case of using Resbond as the insulating paste 1003a, for example, the applied insulating paste 1003a is kept at approximately 70° C. for approximately two hours. Also, in the case of using Niccera Coat as the insulating paste 1003a, for example, the applied insulating paste 1003a is kept at approximately 100° C. for approximately 0.5 hours. Also, in the case of using Sumiceram as the insulating paste 1003a, for example, the applied insulating paste 1003a is kept at approximately 100° C. for approximately 0.5 hours.

Once the insulating paste 1003a hardens in this way, it becomes the inorganic covering material 13 discussed earlier (FIGS. 2A and 2B). In other words, the inorganic covering material 13 covers the hanging part P of the fuse unit 12c, and the hanging part P is encapsulated by the inorganic covering material 13. According to the above steps, the printed wiring board 10 illustrated in FIGS. 2A and 2B is completed.

Figure 12A:
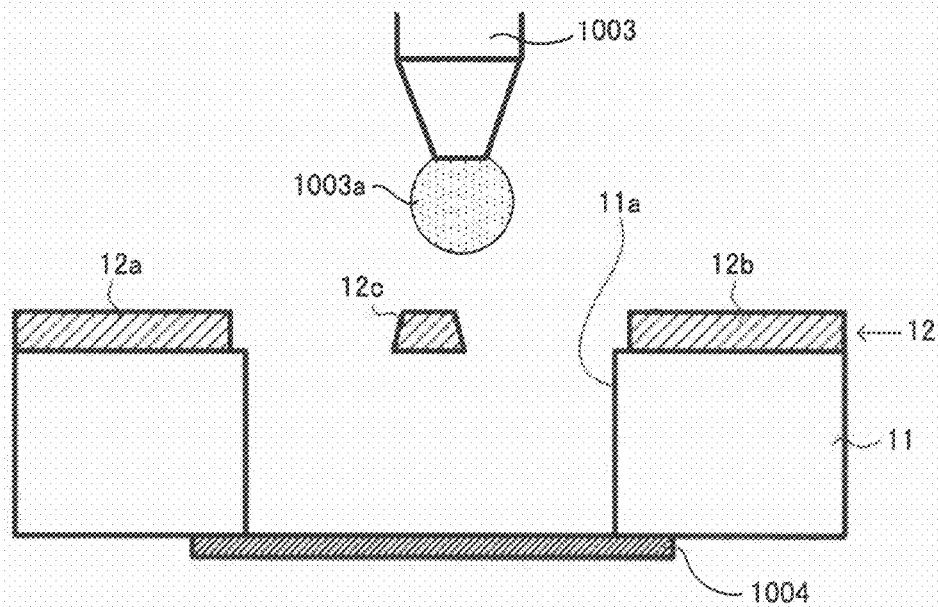
FIG. 12A is a diagram for explaining a first step of another exemplary inorganic covering material forming method in an embodiment of the present invention.
Figure 12B:
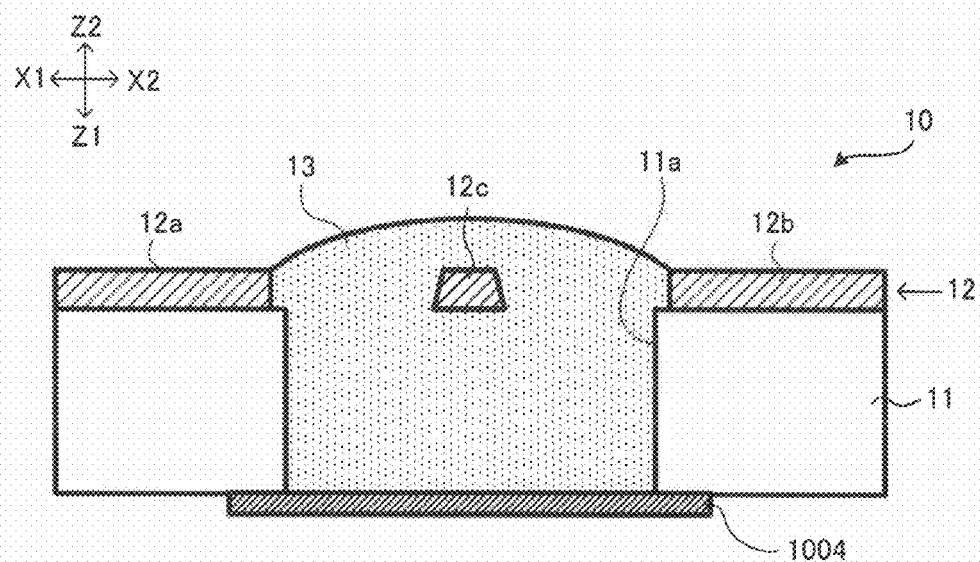
FIG. 12B is a diagram for explaining a second step after the step in FIG. 12A.

However, the inorganic covering material 13 formation method is arbitrary. FIGS. 12A and 12B respectively illustrate alternative examples of inorganic covering material 13 formation methods.

As illustrated in FIG. 12A for example, a plate 1004 may also be provided in order to prevent spillage of the insulating paste 1003a out towards the first surface side of the resinous substrate 11. By filling the hole 11a with the insulating paste 1003a from the second surface side of the resinous substrate 11 while in a state where the first side surface of the hole 11a is blocked off by the plate 1004, a printed wiring board 10 having a plate 1004 on the first side surface of the resinous substrate 11 is completed, as illustrated in FIG. 12B. Also, by removing the plate 1004, the printed wiring board 10 illustrated in FIGS. 2A and 2B is completed.

Figure 14:
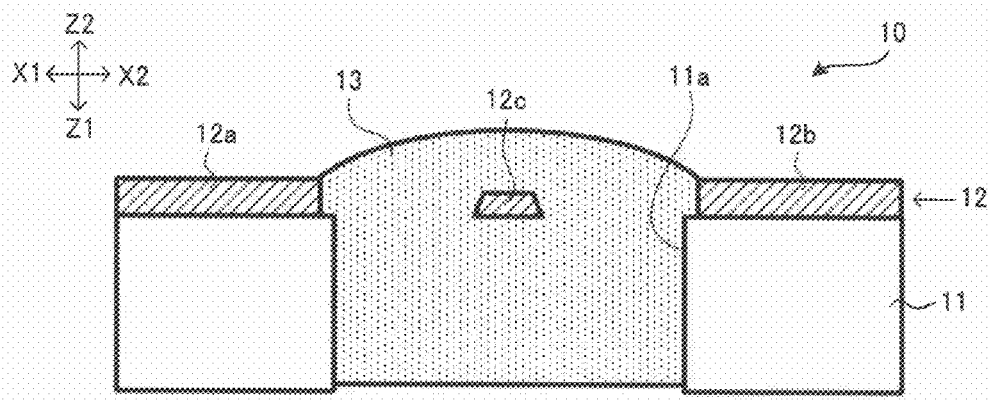
FIG. 14 is a diagram illustrating an exemplary fuse unit that is thinner than a first terminal unit and a second terminal unit in an embodiment of the present invention.
Figure 15:
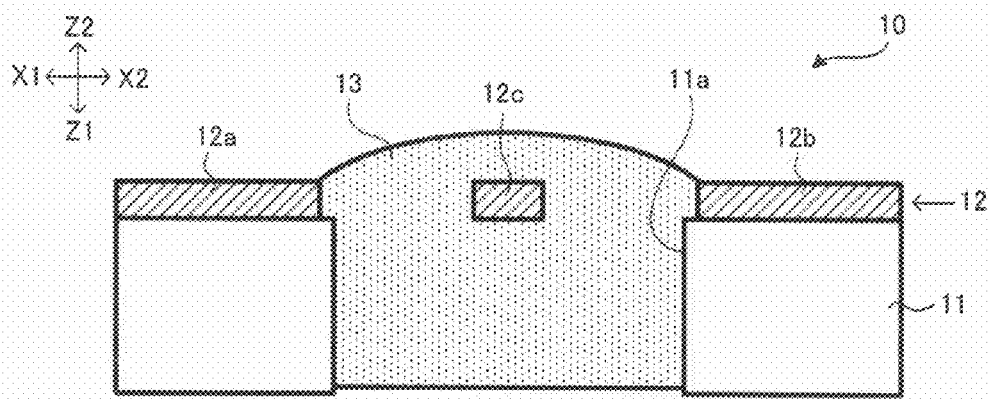
FIG. 15 is a diagram illustrating another exemplary cross-sectional shape of a fuse unit in an embodiment of the present invention.

The present invention is not limited to the above embodiment, and may also be carried out by modifying as follows, for example. FIG. 13A is a diagram illustrates an example wherein an inorganic covering material 13 protrudes out over a first terminal unit 12a and a second terminal unit 12b in an embodiment of the present invention. FIG. 13B illustrates an example wherein an inorganic covering material 13 covers the entirety of a first surface or a second surface on a printed wiring board 10 in an embodiment of the present invention. FIG. 14 illustrates an exemplary fuse unit 12c that is thinner than a first terminal unit 12a and a second terminal unit 12b in an embodiment of the present invention. FIG. 15 illustrates another exemplary cross-sectional shape of a fuse unit 12c in an embodiment of the present invention. FIGS. 16A to 17B respectively illustrate alternative examples of a conductor pattern of a fuse unit 12c in an embodiment of the present invention.

The inorganic covering material 13 may also protrude out from the hole 11a. As illustrated in FIG. 13A for example, an inorganic covering material 13 protruding out from a hole 11a may also exist over a first terminal unit 12a and a second terminal unit 12b. Also, as illustrated in FIG. 13B for example, an inorganic covering material 13 may also cover the entirety of a first surface or a second surface of a printed wiring board 10.

The circuit cross-sectional area of the fuse unit 12c may also be adjusted by thickness. As illustrated in FIG. 14 for example, the thickness of a fuse unit 12c may be thinner than a first terminal unit 12a and a second terminal unit 12b. In so doing, the resistance of the fuse unit 12c increases, and the fuse unit 12c melts down more readily.

The cross-sectional shape (X-Z cross-section) of the fuse unit 12c is not limited to an approximate trapezoid (see FIG. 2B) and is arbitrary. As illustrated in FIG. 15 for example, the cross-sectional shape may also be approximately rectangular.

The conductor pattern of the fuse unit 12c is arbitrary.

Figure 16A:
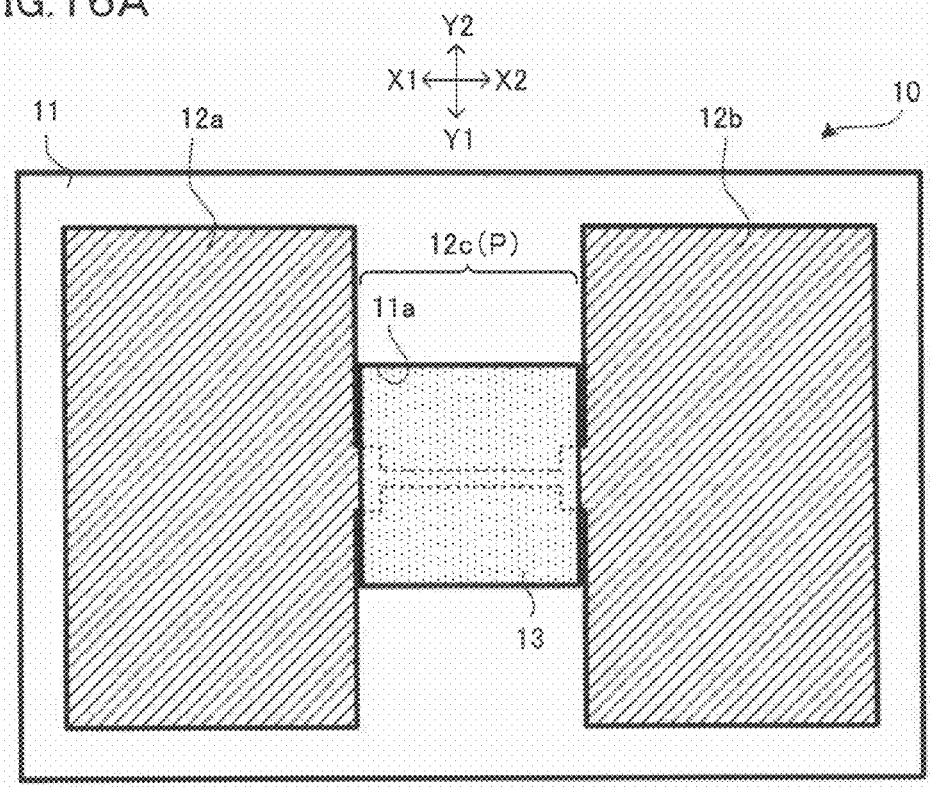
FIG. 16A is a diagram illustrating a first alternative example of a conductor pattern of a fuse unit in an embodiment of the present invention.

As illustrated in FIG. 16A for example, the conductor pattern of the fuse unit 12c may also be a linear pattern. In this example, the parts coupling the fuse unit 12c to the first terminal unit 12a and the second terminal unit 12b are thicker. In so doing, the fuse unit 12c melts down more readily inside the hole 11a. As a result, it becomes easier to reliably obtain the earlier-discussed effect of preventing the scattering of conductor material by the inorganic covering material 13 and the effect of suppressing oxidation of the resinous substrate 11 by the hole 11a.

Figure 16B:
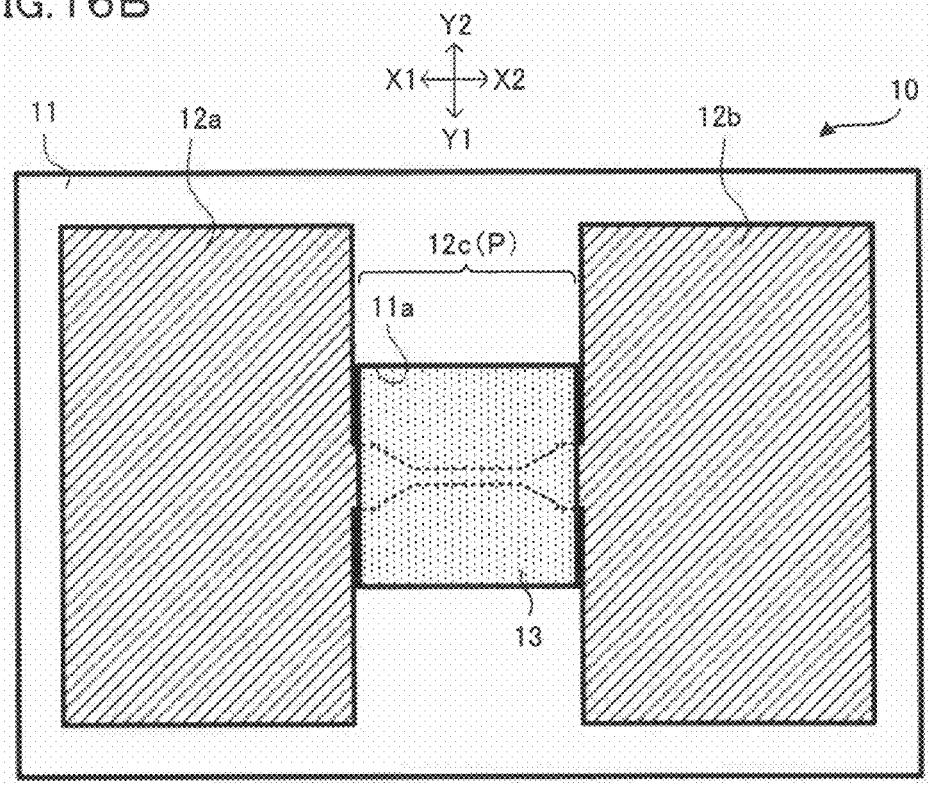
FIG. 16B is a diagram illustrating a second alternative example of a conductor pattern of a fuse unit in an embodiment of the present invention.

Also, as illustrated in FIG. 16B for example, the parts coupling the fuse unit 12c to the first terminal unit 12a and the second terminal unit 12b may also be tapered (a shape wherein the width at the first terminal unit 12a and the width at the second terminal unit 12b are larger than the width of the central part of the fuse unit 12c). By smoothing both ends of the fuse unit 12c, it conceivably becomes easier to suppress cracking due to repeated heat stress.

Figure 17A:
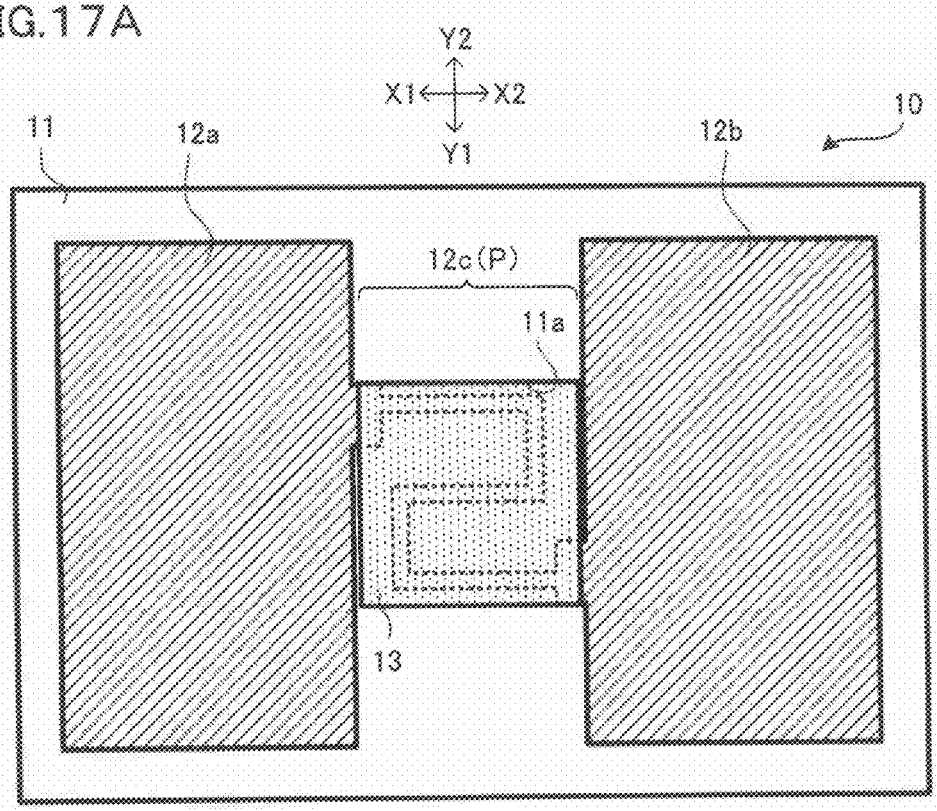
FIG. 17A is a diagram illustrating a third alternative example of a conductor pattern of a fuse unit in an embodiment of the present invention.
Figure 17B:
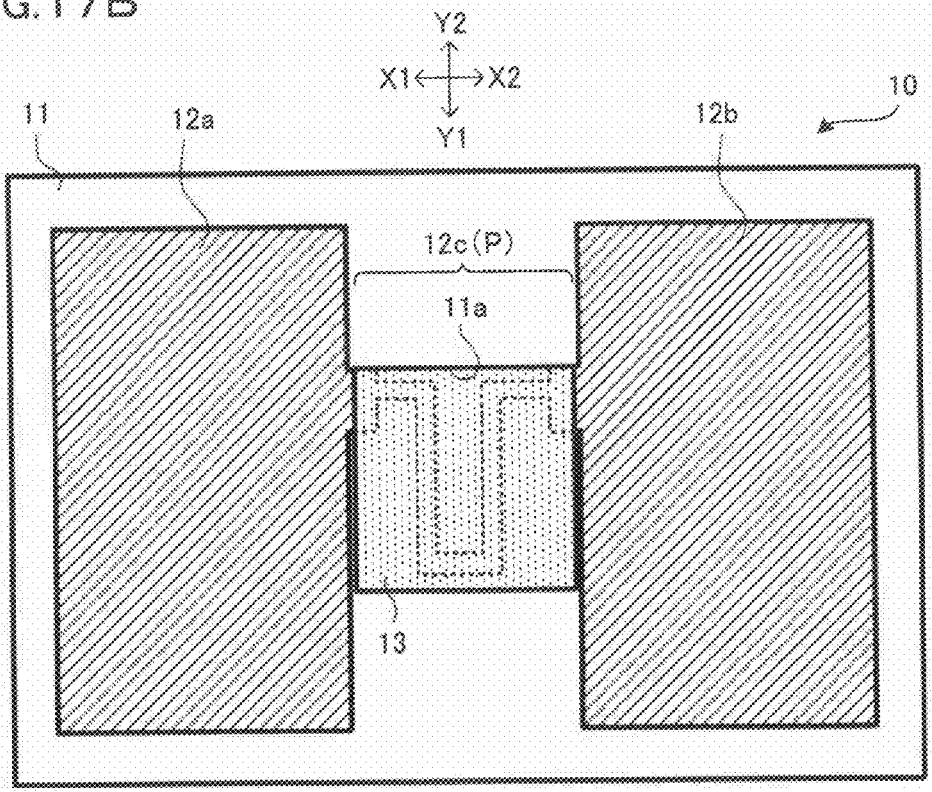
FIG. 17B is a diagram illustrating a fourth alternative example of a conductor pattern of a fuse unit in an embodiment of the present invention.

As illustrated in FIG. 17A for example, the conductor pattern of the fuse unit 12c may also be an approximate S-shaped pattern. By increasing the distance between the first terminal unit 12a and the second terminal unit 12b, it conceivably becomes easier to decrease the effects of heat propagated from the fuse unit 12c to the first terminal unit 12a and the second terminal unit 12b. Also, since the pattern length becomes longer and less susceptible to the effects of heat propagation to the first terminal unit 12a and the second terminal unit 12b at the central portion of the pattern, it conceivably becomes easier to decrease error in the meltdown current (see FIG. 5). Additionally, as a result, it is conceivable that the fuse unit 12c will melt down more readily at a current as designed (the meltdown current). The parts where the pattern curves in an S-shaped pattern may be curved or straight. Also, as illustrated in FIG. 17B for example, the conductor pattern of the fuse unit 12c may also be a U-shaped pattern that does not proceed directly in the direction in which the first terminal unit 12a and the second terminal unit 12b are arranged (the X direction), but instead detours in the Y direction orthogonal to the X direction.

In the example illustrated in FIGS. 2A and 2B, part of the fuse unit 12c becomes the hanging part P, but in the examples illustrated in FIGS. 16A to 17B, all of the fuse unit 12c becomes the hanging part P. Additionally, by making the hanging part P a narrow linear pattern, the resistance of the hanging part P is increased more than its surrounding parts. In so doing, meltdown at the hanging part P occurs more reliably.

Figure 18A:
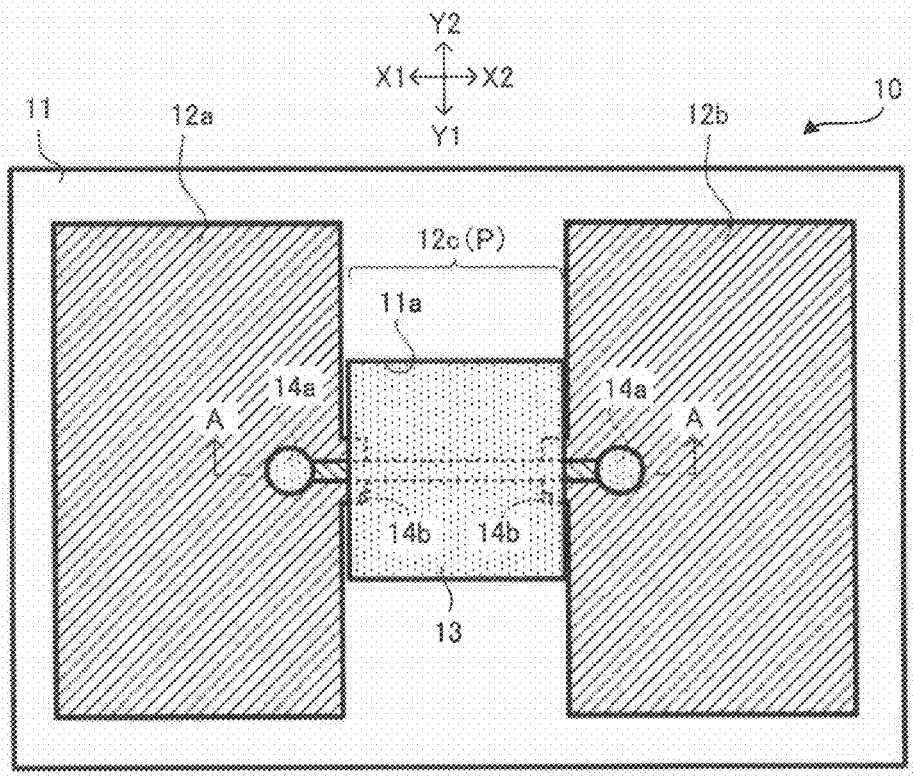
FIG. 18A is a diagram illustrating a first example of forming a fuse unit using a conductor bar formed separately from a first terminal unit and a second terminal unit in an embodiment of the present invention.
Figure 18B:
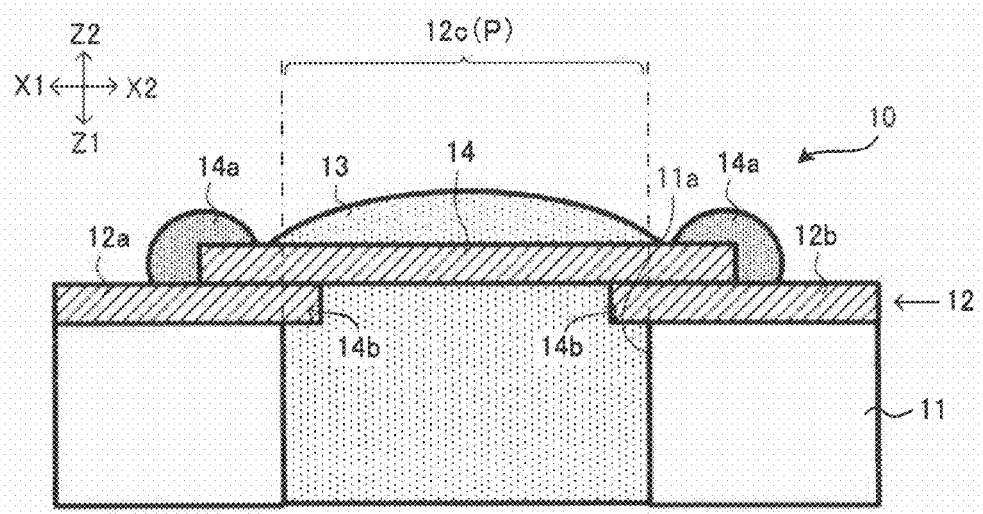
FIG. 18B is a cross-section along A-A in FIG. 18A.

It is not necessary for the first terminal unit 12a, the second terminal unit 12b, and the fuse unit 12c to be integrally formed. FIG. 18A illustrates a first example of forming a fuse unit 12c using a conductor bar 14 formed separately from a first terminal unit 12a and a second terminal unit 12b in an embodiment of the present invention. FIG. 18B is a cross-section along A-A in FIG. 18A.

As illustrated in FIGS. 18A and 18B (a cross-section along A-A in FIG. 18A) for example, a separately formed conductor bar 14 may be used, and both its ends respectively coupled to the first terminal unit 12a and the second terminal unit 12b by a conductive adhesive 14a (or solder), for example. Since the conductor bar 14 constitutes the fuse unit 12c with such a structure, adjustment of the thickness of the fuse unit 12c becomes easy, and thus it is conceivable that the fuse unit 12c will melt down more readily at a current as designed (the meltdown current). The conductor bar 14 may be made up of copper, for example, similarly to the first terminal unit 12a and the second terminal unit 12b. However, the above is not limiting, and the material of the conductor bar 14 is arbitrary. By using a conductor bar 14 formed separately from the first terminal unit 12a and the second terminal unit 12b, it becomes easy to make the material of the fuse unit 12c a material different from the material of the first terminal unit 12a and the second terminal unit 12b. As a result, it also becomes easy to choose a highly resistive metal or a metal with a low temperature at meltdown, etc. as the material of the fuse unit 12c.

Also, projections 14b are formed at the parts where the conductor bar 14 is positioned due to the conductor of the conductor layer 12 protruding out towards the hole 11a from the respective sides of the first terminal unit 12a and the second terminal unit 12b. These projections 14b are equivalent to parts coupling the fuse unit 12c to the first terminal unit 12a and the second terminal unit 12b. The projections 14b have a greater width than the conductor bar 14. In so doing, the high-resistance part of the fuse unit 12c (the portion of small circuit cross-sectional area) is positioned inside the hole 11a and the fuse unit 12c melts down more readily inside the hole 11a. However, the projections 14b are not necessary features, and may also be omitted.

Figure 19A:
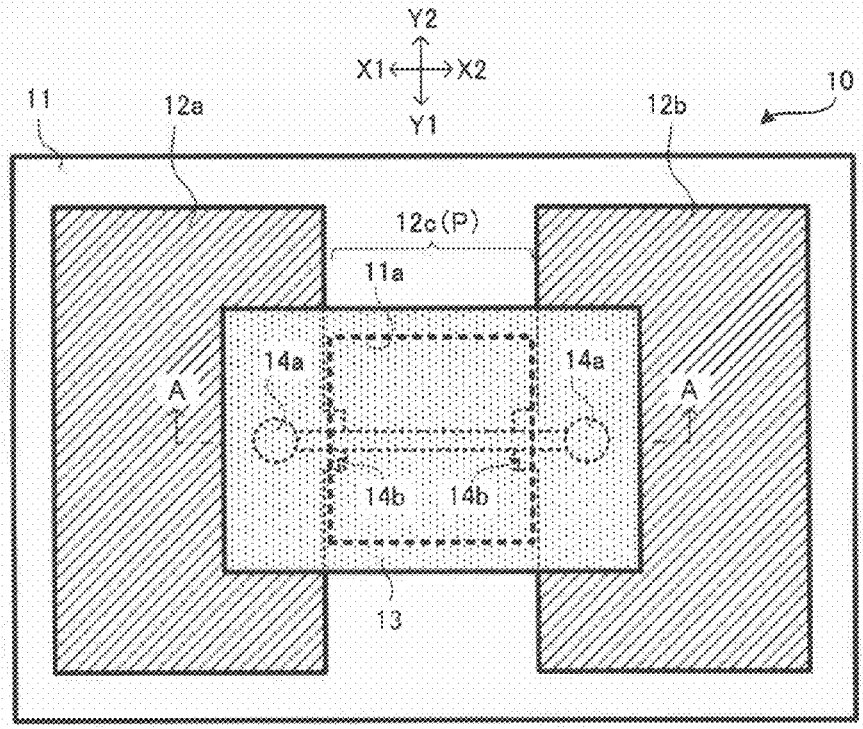
FIG. 19A is a diagram illustrating a second example of forming a fuse unit using a conductor bar formed separately from a first terminal unit and a second terminal unit in an embodiment of the present invention.
Figure 19B:
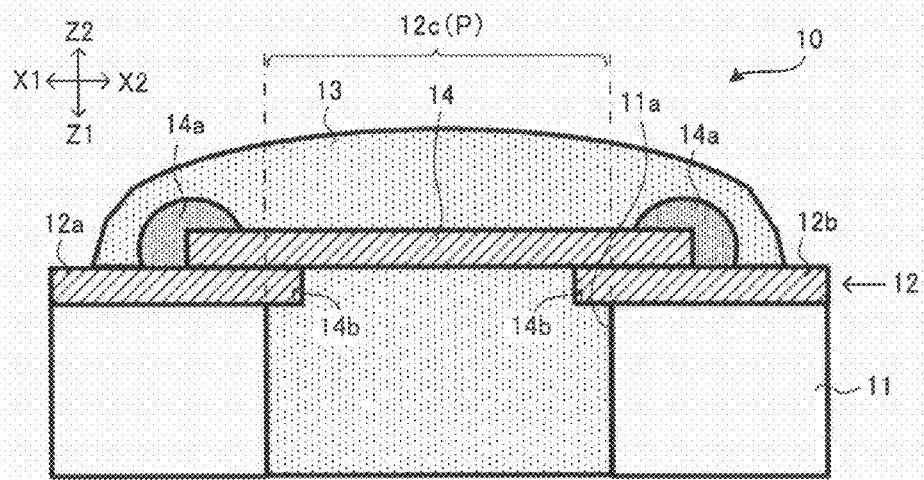
FIG. 19B is a cross-section along A-A in FIG. 19A.

FIG. 19A illustrates a second example of forming a fuse unit 12c using a conductor bar formed separately from a first terminal unit 12a and a second terminal unit 12b in an embodiment of the present invention. FIG. 19B is a cross-section along A-A in FIG. 19A.

In the example in FIGS. 18A and 18B, although the fuse unit 12c is covered by the inorganic covering material 13, the adhesive 14a is exposed from the inorganic covering material 13. However, this is not limiting, and as illustrate in FIGS. 19A and 19B (a cross-section along A-A in FIG. 19A) for example, the inorganic covering material 13 may also cover the adhesive 14a. Additionally, the adhesive 14a may also be omitted in the case where the conductor bar 14 can be fixed in place with the inorganic covering material 13.

Figure 21A:
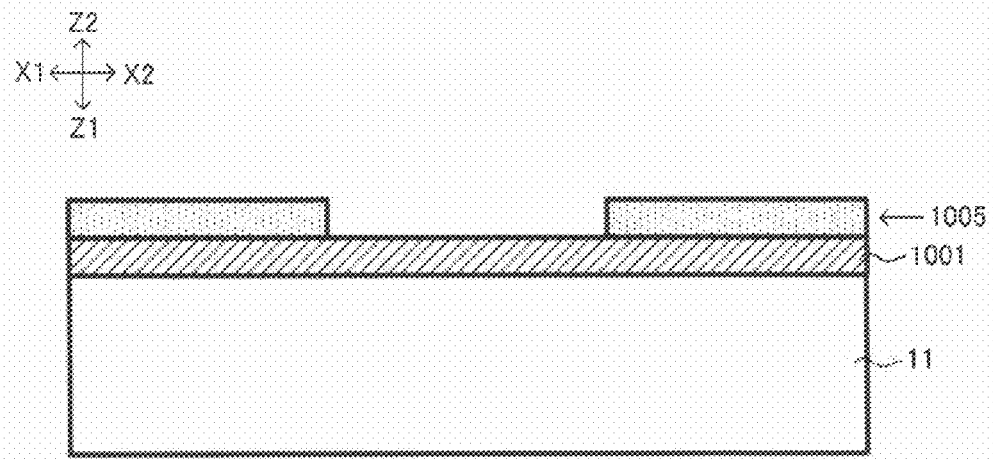
FIG. 21A is a diagram for explaining a first step of the manufacturing method in FIG. 20.
Figure 21B:
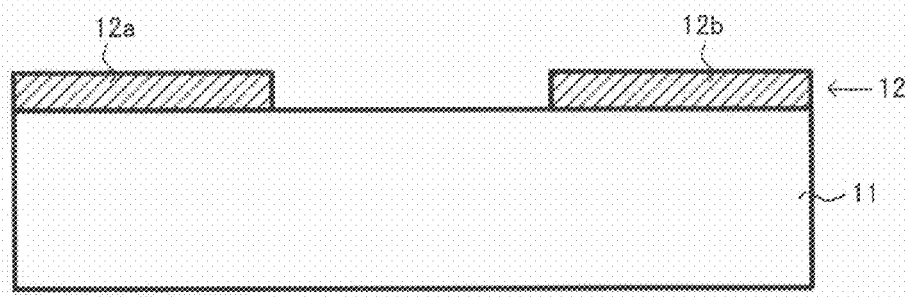
FIG. 21B is a diagram for explaining a second step after the step in FIG. 21A.
Figure 21C:
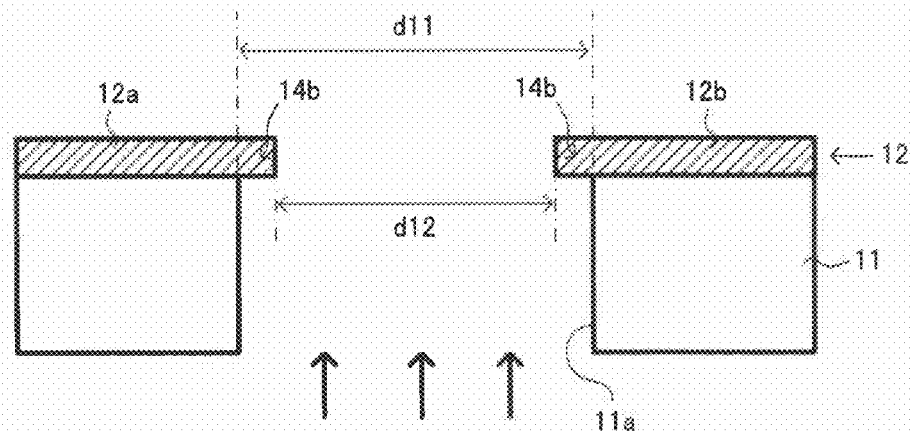
FIG. 21C is a diagram for explaining a third step after the step in FIG. 21B.
Figure 22A:
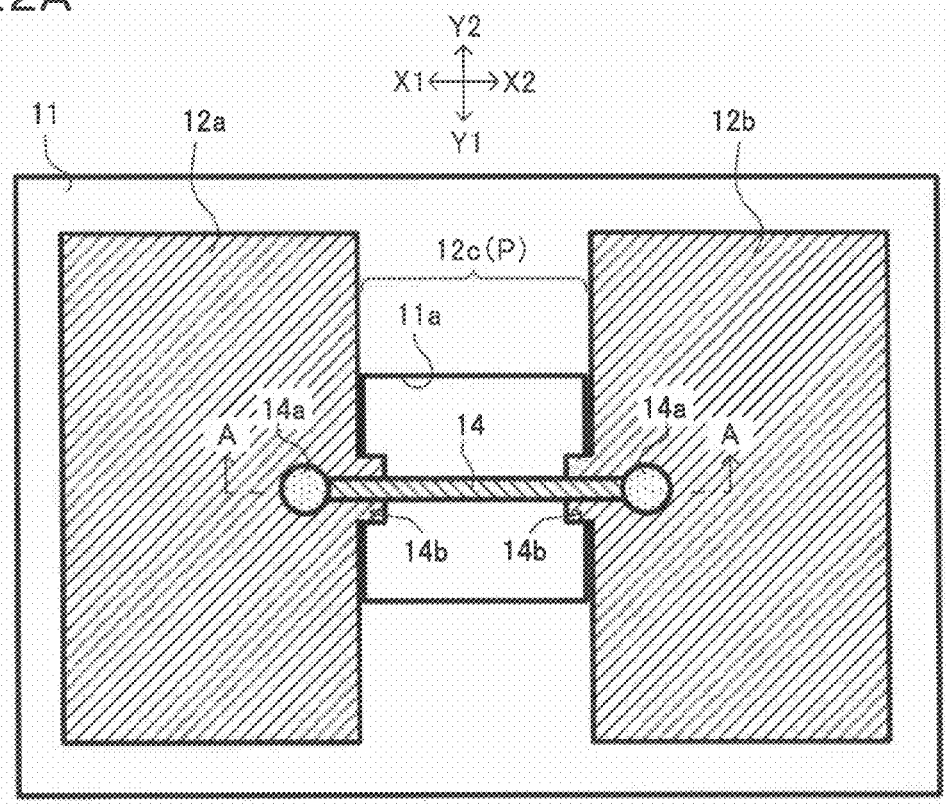
FIG. 22A is a diagram for explaining a fourth step after the step in FIG. 21C.
Figure 22B:
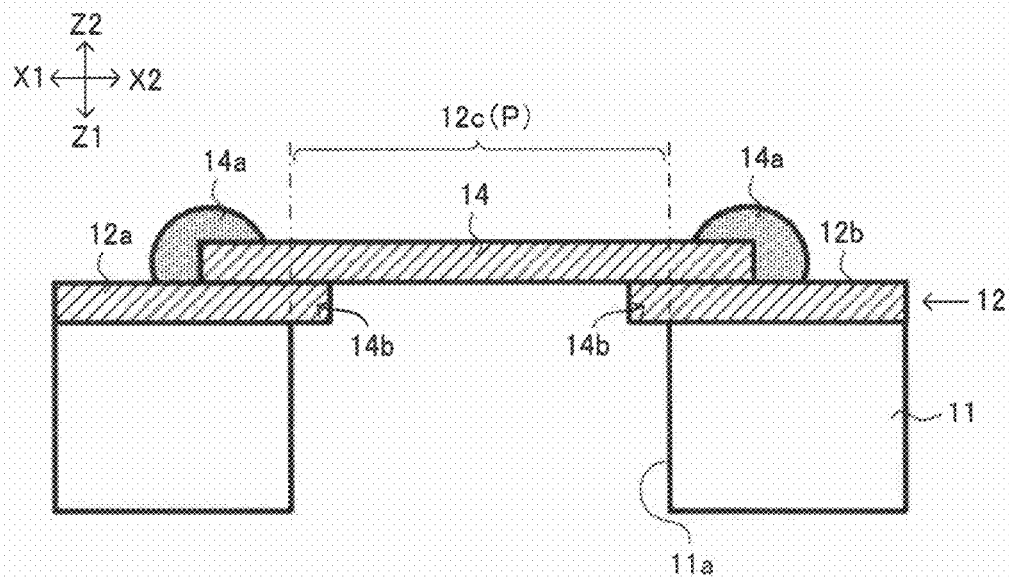
FIG. 22B is a cross-section along A-A in FIG. 22A.

The printed wiring board 10 illustrated in FIGS. 18A and 18B is manufactured by steps like those illustrated in FIG. 20, for example. FIG. 20 is a flowchart illustrating an exemplary method of manufacturing the printed wiring board 10 illustrated in FIGS. 18A and 18B. FIGS. 21A to 22B are diagrams for explaining respective steps in the method of manufacturing the printed wiring board 10 illustrated in FIGS. 18A and 18B. Herein, FIG. 22B is a cross-section along A-A in FIG. 22A.

In step S21, a resinous substrate 11 is prepared similarly to step S11 in FIG. 6. In other words, a single-sided copper clad laminate 1000 in which copper foil 1001 is formed on one side of the resinous substrate 11 is taken to be a starting material, for example.

Subsequently, in step S22 in FIG. 20, a first terminal unit 12a and a second terminal unit 12b are formed on the resinous substrate 11. As illustrated in FIG. 21A for example, resist 1005 having a pattern corresponding to the first terminal unit 12a and the second terminal unit 12b is printed onto the copper foil 1001 of the single-sided copper clad laminate 1000. Subsequently, as illustrated in FIG. 21B for example, the parts of the copper foil 1001 where the resist 1005 is not formed are etched. In so doing, the first terminal unit 12a and the second terminal unit 12b are formed as the conductor layer 12.

Subsequently, in step S23 in FIG. 20, an approximately cuboid hole 11a is formed in the resinous substrate 11. By making the aperture width d11 of the hole 11a on the second surface side larger than the aperture width d12 of the conductor layer 12 on the first surface side, projections 14b are formed as illustrated in FIG. 21C. The hole 11a can be formed by radiating a laser (a $CO_2$ laser, for example) from the first surface side of the resinous substrate 11, for example. After that resin on the interior surface of the hole 11a is removed as necessary and inorganic stiffener is exposed. However, the above is not limiting, and the hole 11a formation method is arbitrary.

Subsequently, a fuse unit 12c is formed in step S24 in FIG. 20. More specifically, as illustrated in FIGS. 22A and 22B, both ends of a separately formed conductor bar 14 are positioned over the projections 14b of the first terminal unit 12a and the second terminal unit 12b and respectively coupled to the first terminal unit 12a and the second terminal unit 12b with a conductive adhesive 14a, for example.

Subsequently, in step S25 in FIG. 20, an inorganic covering material 13 is formed similarly to step S14 in FIG. 6. According to the above steps, the printed wiring board 10 illustrated in FIGS. 18A and 18B is completed.

In the above manufacturing method, the hole 11a is formed before the formation of the fuse unit 12c. However, this is not limiting, and the hole 11a may also be formed after the formation of the fuse unit 12c. The hole 11a may also be formed by a method other than laser, such as with a drill or wet etching, for example.

Figure 23:
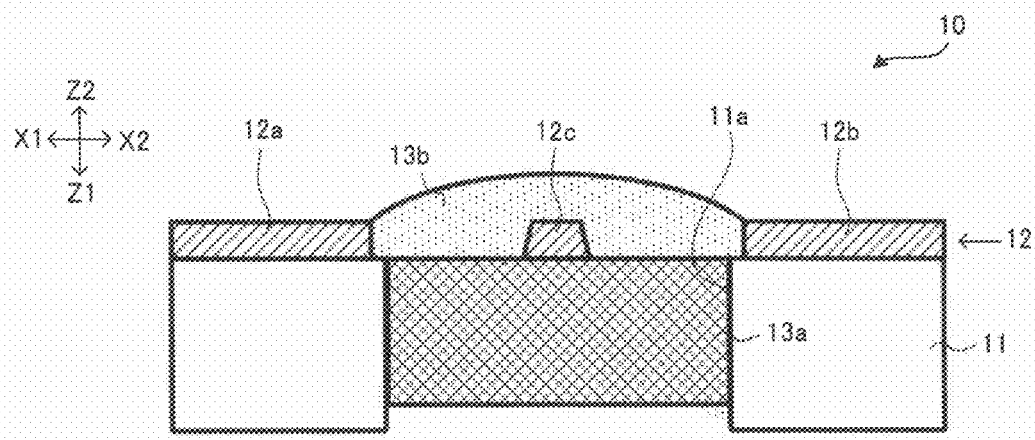
FIG. 23 is a diagram illustrating a first example wherein a fuse unit on an inorganic solid substance is covered with an insulating paste in an embodiment of the present invention.
Figure 24:
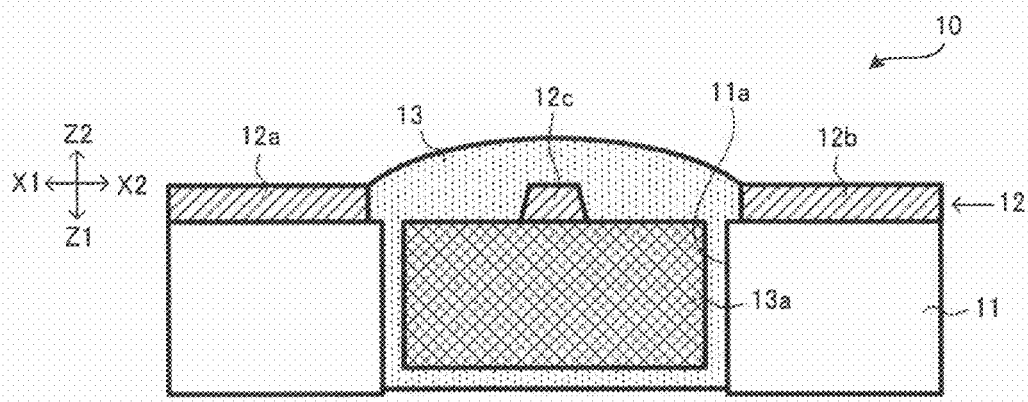
FIG. 24 is a diagram illustrating a second example wherein a fuse unit on an inorganic solid substance is covered with an insulating paste in an embodiment of the present invention.
Figure 25A:
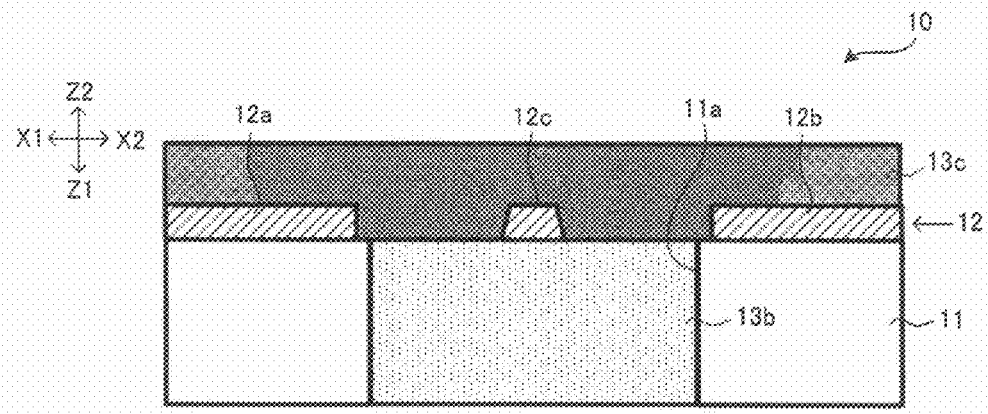
FIG. 25A is a diagram illustrating an example wherein a fuse unit on an insulating paste is covered with an insulating film in an embodiment of the present invention.
Figure 25B:
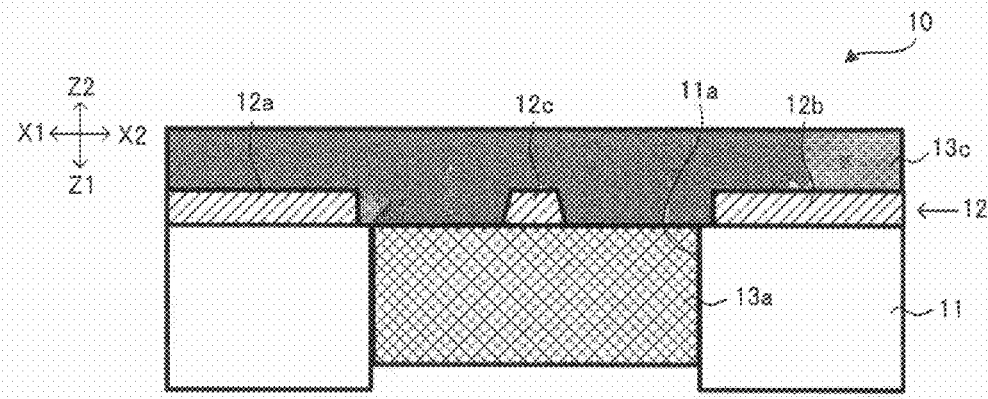
FIG. 25B is a diagram illustrating an example wherein a fuse unit on an inorganic solid substance is covered with an insulating film in an embodiment of the present invention.
Figure 26A:
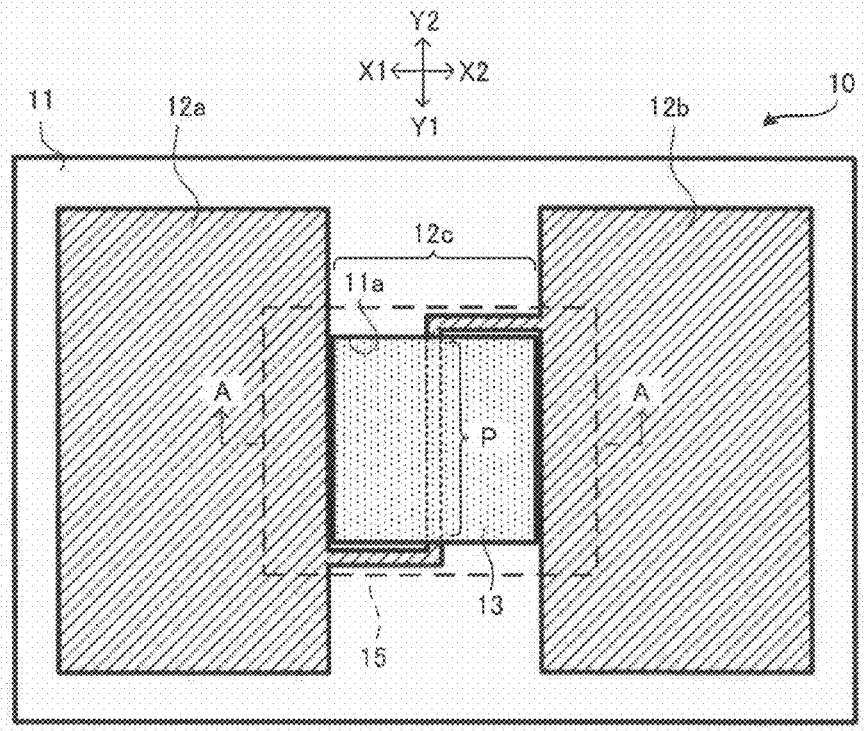
FIG. 26A is a diagram illustrating an example wherein a cover is provided on a printed wiring board in an embodiment of the present invention.
Figure 26B:
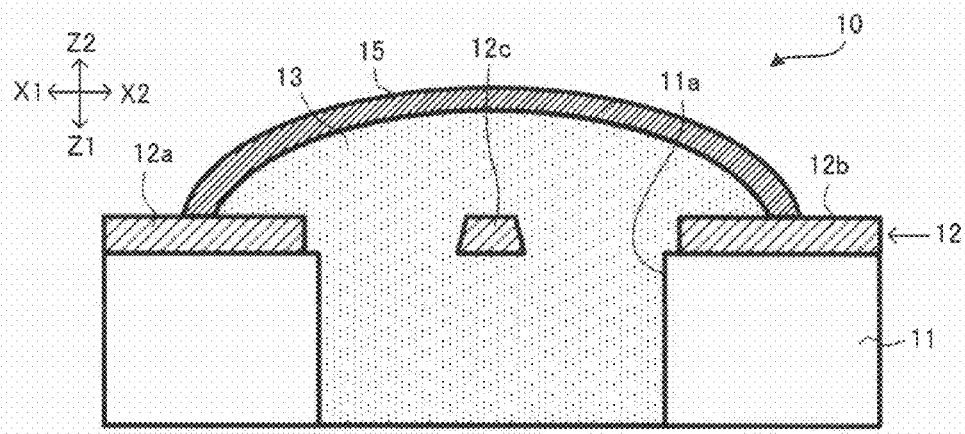
FIG. 26B is a cross-section along A-A in FIG. 26A.

FIGS. 23 and 24 illustrate a examples wherein a fuse unit 12c on an inorganic solid substance 13a is covered with an insulating paste 13b in an embodiment of the present invention. FIG. 25A illustrates an example wherein a fuse unit 12c on an insulating paste 13b is covered with an insulating film 13c in an embodiment of the present invention. FIG. 25B illustrates an example wherein a fuse unit 12c on an inorganic solid substance 13a is covered with an insulating film 13c in an embodiment of the present invention. FIG. 26A illustrates an example wherein a cover 15 is provided on a printed wiring board 10 in an embodiment of the present invention. FIG. 26B is a cross-section along A-A in FIG. 26A. Also, FIGS. 27 and 28 respectively illustrates alternative examples of a printed wiring board 10 having a cover 15 in an embodiment of the present invention.

As illustrated in FIG. 23 for example, a fuse unit 12c disposed on top of an inorganic solid substance 13a may be covered with an insulating paste 13b made up of an inorganic substance. Such a structure can be formed by, for example, disposing a porous inorganic solid substance 13a inside the hole 11a, then forming the fuse unit 12c on top of the inorganic solid substance 13a and covering the fuse unit 12c with the insulating paste 13b. Also, the inorganic solid substance 13a may be affixed to the resinous substrate 11 with a separate inorganic binder discussed earlier, etc., or as illustrated in FIG. 24, the inorganic solid substance 13a may be affixed to the resinous substrate 11 by the inorganic covering material 13.

Also, as illustrated in FIG. 25A for example, a fuse unit 12c disposed on top of a insulating paste 13b made up of an inorganic substance may be covered with an insulating film 13c made up of an inorganic substance. Such a structure can be formed by, for example, filling the hole 11a with the insulating paste 13b, then forming the fuse unit 12c on top of the insulating paste 13b and covering the fuse unit 12c with the insulating film 13c. Also, as illustrated in FIG. 25B, a fuse unit 12c disposed on top of an insulating inorganic solid substance 13a may be covered with an insulating film 13c made up of an inorganic substance. Such a structure can be formed by, for example, disposing the inorganic solid substance 13a inside the hole 11a, then forming the fuse unit 12c on top of the inorganic solid substance 13a and covering the fuse unit 12c with the insulating film 13c. In this case, either the insulating film or the inorganic solid substance may be porous.

As illustrated in FIGS. 26A and 26B (a cross-section along A-A in FIG. 26A) for example, a cover 15 may also be provided on the second surface side of the printed wiring board 10. In this example, the cover 15 is a plate with a curved surface that bulges outward on the second surface side. However, the shape, size, etc. of the cover 15 is arbitrary. Also, with such a structure, the hole 11a may be filled with inorganic covering material 13 from the first surface side of the resinous substrate 11 while in a state where the cover 15 is provided on the second surface side of the resinous substrate 11. If the inorganic covering material 13 is formed with such a technique, it conceivably becomes easier to suppress spillage of the inorganic covering material 13 outside of the cover 15 due to the presence of the cover 15 when filling with the inorganic covering material 13 (an insulating paste).

Figure 27:
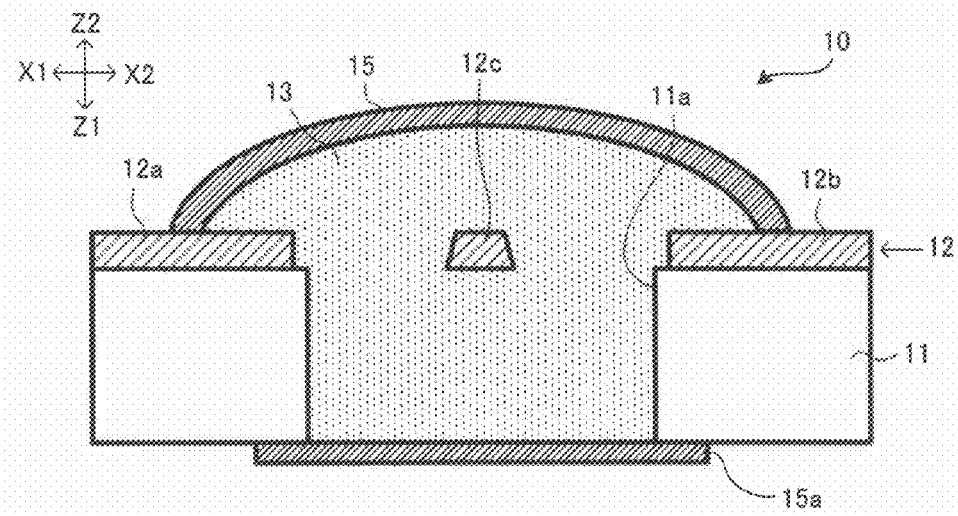
FIG. 27 is a diagram illustrating a first alternative example of a printed wiring board having a cover in an embodiment of the present invention.
Figure 28:
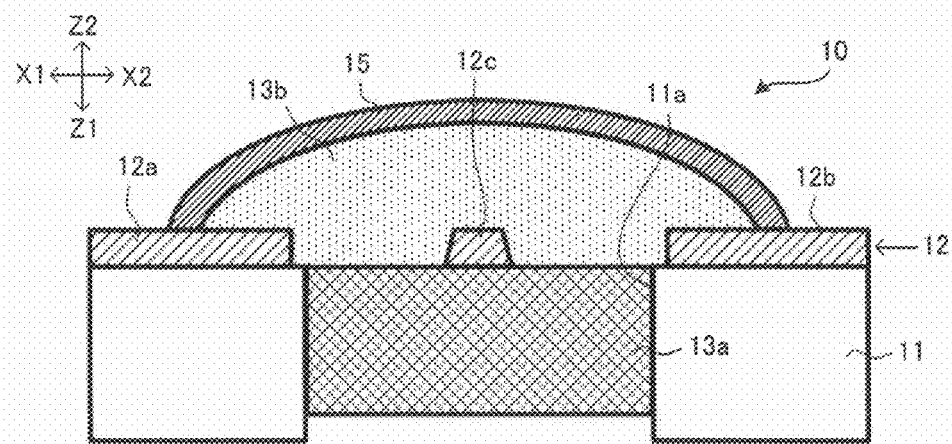
FIG. 28 is a diagram illustrating a second alternative example of a printed wiring board having a cover in an embodiment of the present invention.

Also, as illustrated in FIG. 27, the cover 15 may also be applied to the structure illustrated in the previous FIG. 12B. In the example in FIG. 27, a cover 15 is provided on the second surface side of the printed wiring board 10, while a cover 15a that blocks off the aperture on the first surface side of the hole 11a is provided on the first surface side of the printed wiring board 10. The cover 15a is planar in this example, but the shape, size, etc. of the cover 15a is arbitrary. Furthermore, as illustrated in FIG. 28, the cover 15 may also be applied to the structure illustrated in the previous FIG. 23. Although not illustrated, the cover 15 or the cover 15a may also be applied to other structures.

Figure 29:
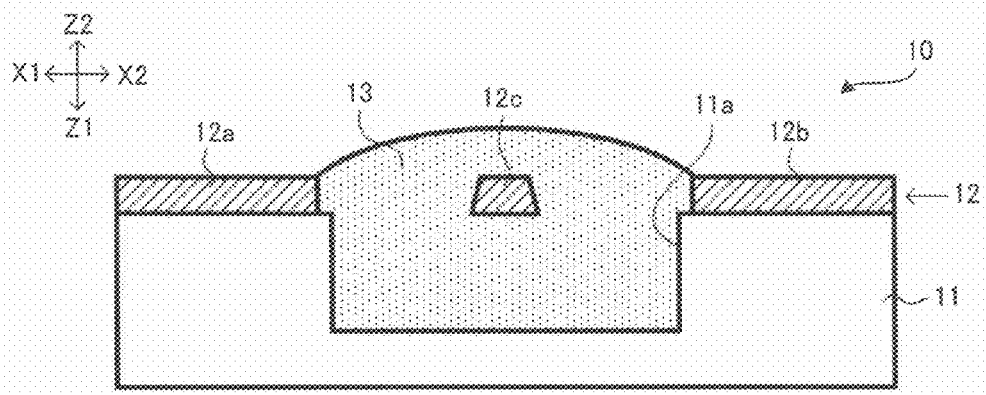
FIG. 29 is a diagram illustrating an exemplary printed wiring board having a resinous substrate in which a non-penetrating hole is formed in an embodiment of the present invention.
Figure 30A:
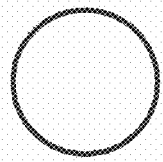
FIG. 30A is a diagram illustrating a first alternative example of the horizontal cross-sectional shape of an aperture unit in an embodiment of the present invention.
Figure 30B:
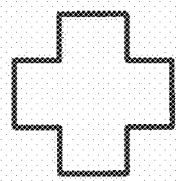
FIG. 30B is a diagram illustrating a second alternative example of the horizontal cross-sectional shape of an aperture unit in an embodiment of the present invention.
Figure 30C:
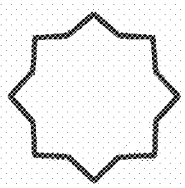
FIG. 30C is a diagram illustrating a third alternative example of the horizontal cross-sectional shape of an aperture unit in an embodiment of the present invention.
Figure 31A:
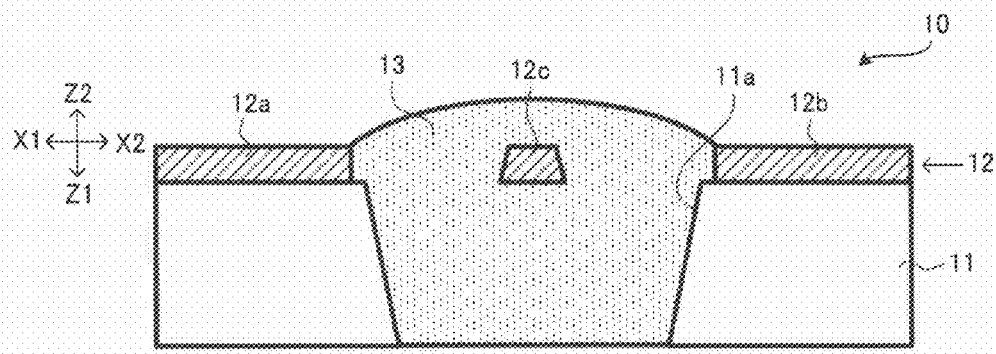
FIG. 31A is a diagram illustrating a first alternative example of the vertical cross-sectional shape of an aperture unit in an embodiment of the present invention.
Figure 31B:
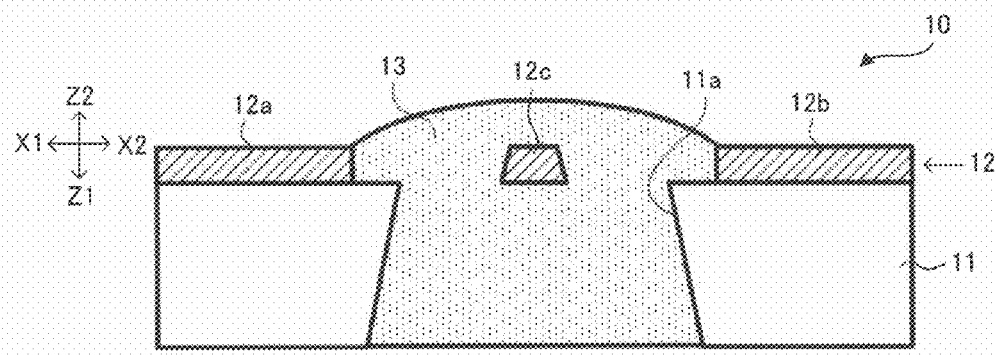
FIG. 31B is a diagram illustrating a second alternative example of the vertical cross-sectional shape of an aperture unit in an embodiment of the present invention.
Figure 31C:
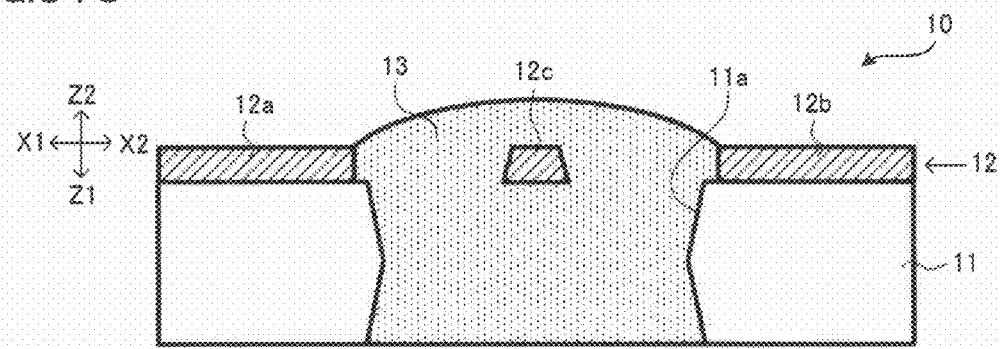
FIG. 31C is a diagram illustrating a third alternative example of the vertical cross-sectional shape of an aperture unit in an embodiment of the present invention.

FIG. 29 illustrates an exemplary printed wiring board 10 having a resinous substrate in which a non-penetrating hole (hole 11a) is formed in an embodiment of the present invention. FIGS. 30A to 30C respectively illustrate alternative examples of the horizontal cross-sectional shape of an aperture unit in an embodiment of the present invention. FIGS. 31A to 31C respectively illustrate alternative examples of the vertical cross-sectional shape of an aperture unit in an embodiment of the present invention.

As illustrated in FIG. 29 for example, the hole 11a may also be a non-penetrating hole. In other words, the hole 11a illustrated in FIG. 29 is an approximately cuboid, non-penetrating hole provided so as to not penetrate the resinous substrate 11 on the lower side (Z1 side) of the conductor unit of the fuse unit 12c.

The shape of the hole 11a in horizontal cross-section (X-Y plane) is arbitrary.

For example, besides being rectangular, the horizontal cross-sectional shape of the hole 11a (aperture unit) may be approximately circular as illustrated in FIG. 30A for example, or alternatively, approximately triangular, approximately hexagonal, approximately octagonal, or some other approximately polygonal shape, or approximately elliptical. Herein, the shapes of the corners of an approximately polygonal shape are arbitrary, and may be for example approximately right angles, approximately acute angles, approximately obtuse angles, or rounded. However, the corners are preferably rounded in order to prevent concentrations of heat stress. The hole 11a may be a penetrating hole or a non-penetrating hole.

Also, as illustrated in FIGS. 30B and 30C for example, the horizontal cross-sectional shape of the hole 11a (aperture unit) may also be approximately cross-shaped or an approximately regular polygonal star shape, or other shape radiating outward from the center in straight lines (a shape in which a plurality of wings are disposed radiating outward).

The vertical cross-sectional shape of the hole 11a (aperture unit) is also arbitrary. As illustrate in FIG. 31A for example, the shape of the hole 11a (aperture unit) may also be a tapered approximately circular column (approximately circular truncated cone) that tapers so as to constrict while proceeding from the second surface side to the first surface side of the resinous substrate 11, for example. Alternatively, as illustrated in FIG. 31B, the shape of the hole 11a (aperture unit) may be a tapered approximately circular column (approximately circular truncated cone) that tapers so as to constrict while proceeding from the first surface side to the second surface side of the resinous substrate 11, for example. Additionally, as illustrated in FIG. 31C, the shape of the hole 11a (aperture unit) may be an approximate drum shape that tapers so as to constrict while proceeding inwards from both the first surface side and the second surface side of the resinous substrate 11, for example.

The configuration of the printed wiring board 10, a printed wiring board, or electronic devices, etc., and the type, properties, dimensions, materials, shapes, layers, disposition, etc. of their components may be arbitrarily modified without departing from the principal matter of the present invention.

A manufacturing method of the present invention is not limited to the content and sequence illustrated in the flowcharts in FIG. 6 or FIG. 20, and the content and sequence may be arbitrarily modified without departing from the principal matter of the present invention. Also, depending on the application, etc., unnecessary steps may be omitted.

The above embodiments, modification, etc. may be arbitrarily combined. For example, the hole 11a (aperture unit) illustrated in FIGS. 31A to 31C may also be taken to be non-penetrating holes (non-penetrating aperture units).

The foregoing thus explains embodiments of the present invention, but it should be understood that various modifications and combinations required by design circumstances and other factors are to be included in the invention described in the Claims and the scope of the invention corresponding to the specific examples described in the Embodiments for Carrying Out the Invention.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A printed wiring board comprising:
   an insulating resinous substrate having an aperture unit;
   a first terminal unit and a second terminal unit consisting of a conductor and formed on top of the resinous substrate; and
   a fuse unit that electrically couples the first terminal unit and the second terminal unit to each other;
   wherein at least a part of the fuse unit is disposed over the aperture unit, and is covered by a porous inorganic covering material having insulating properties, and
   the inorganic covering material has a coefficient of thermal expansion approximately equal to that of the fuse unit.

2. The printed wiring board according to claim 1, wherein the inorganic covering material includes an inorganic binder and a ceramic filler.

3. The printed wiring board according to claim 2, wherein the ceramic filler is particulate, powdered, or fibrous.

4. The printed wiring board according to claim 2, wherein the ceramic filler consists of at least one from among alumina, zirconia, silica, and silicon carbide.

5. The printed wiring board according to claim 2, wherein the inorganic binder consists of at least one from among soluble silicate, hardened ceramic sol, sepiolite, and attapulgite.

6. The printed wiring board according to claim 5, wherein the ceramic sol consists of at least one from among alumina sol, silica sol, and titania sol.

7. The printed wiring board according to claim 1, wherein the porosity of the inorganic covering material is approximately 10% to approximately 40%.

8. The printed wiring board according to claim 1, wherein resin on the interior surface of the aperture unit in the resinous substrate is removed, and an uneven surface is formed.

9. The printed wiring board according to claim 8, wherein ends of a fibrous stiffener are exposed on the surface.

10. The printed wiring board according to claim 1, wherein the resinous substrate consists of an epoxy resin impregnated with glass cloth.

11. The printed wiring board according to claim 1, wherein the resinous substrate consists of a polyester resin, Bismaleimide-Triazine resin, imide resin, phenol resin, or allyl-containing phenylene ether resin impregnated with paper, glass fiber, or aramid fiber.

12. The printed wiring board according to claim 1, wherein the material of the fuse unit and the material of the first terminal unit and the second terminal unit are approximately the same.

13. The printed wiring board according to claim 1, wherein a conductor width of the fuse unit is in a range from approximately 0.2 mm to approximately 0.5 mm, and a conductor length of the fuse unit is in a range from approximately 2 mm to approximately 15 mm.

14. The printed wiring board according to claim 5, wherein the soluble silicate is water glass with sodium silicate as its principal ingredient.

15. The printed wiring board according to claim 1, wherein the fuse unit is formed with copper, and the coefficient of thermal expansion for the inorganic covering material is in a range from approximately 10 ppm/° C. to approximately 25 ppm/° C.

16. The printed wiring board according to claim 1, wherein the cross-sectional shape of the fuse unit is an approximate trapezoid.

17. The printed wiring board according to claim 1, wherein the cross-sectional shape of the fuse unit is an approximate rectangle.

18. The printed wiring board according to claim 1, wherein the conductor pattern of the fuse unit is
   a linear pattern whose parts coupling the fuse unit to the first terminal unit and the second terminal unit are thicker,
   a pattern whose parts coupling the fuse unit to the first terminal unit and the second terminal unit are tapered,
   an approximately S-shaped pattern whose pattern curves are curved or straight, or
   a U-shaped pattern that does not proceed directly in the X direction in which the first terminal unit and the second terminal unit are arranged, but instead detours in the Y direction orthogonal to the X direction.

19. The printed wiring board according to claim 1, wherein a part of the fuse unit is a hanging part.

20. The printed wiring board according to claim 1, wherein the entirety of the fuse unit is a hanging part.

21. The printed wiring board according to claim 1, wherein the first terminal unit, the second terminal unit, and the fuse unit are integrally formed.

22. The printed wiring board according to claim 1, wherein the fuse unit consists of a conductor bar, the two ends of which are respectively coupled to the first terminal unit and the second terminal unit by a conductive adhesive or solder.

23. An electronic device comprising:
   a plurality of electronic components; and
   the printed wiring board according to claim 1;
   wherein
   the fuse unit is individually provided for each of the plurality of electronic components.

24. The electronic device according to claim 23, wherein the fuse units of the printed wiring board are coupled in series to a power source and the electronic components.

25. The electronic device according to claim 23, wherein a power source and the electronic components are electrically coupled to each other via a load.

26. The electronic device according to claim 23, wherein a plurality of loads are coupled in parallel, and the respective loads are coupled in series to the electronic components and the fuse units.

27. The electronic device according to claim 23, wherein the electronic components are semiconductor elements.

28. The electronic device according to claim 23, wherein each electronic component is an IC circuit, a capacitor, a resistor, or a coil.

29. The printed wiring board according to claim 23, wherein the inorganic covering material includes an inorganic binder and a ceramic filler.

30. The electronic device according to claim 29, wherein the ceramic filler is particulate, powdered, or fibrous.

31. The electronic device according to claim 29, wherein the ceramic filler consists of at least one from among alumina, zirconia, silica, and silicon carbide.

32. The electronic device according to claim 29, wherein the inorganic binder consists of at least one from among soluble silicate, hardened ceramic sol, sepiolite, and attapulgite.

33. The electronic device according to claim 32, wherein the ceramic sol consists of at least one from among alumina sol, silica sol, and titania sol.

34. The electronic device according to claim 23, wherein the porosity of the inorganic covering material of the printed wiring board is approximately 10% to approximately 40%.

35. The electronic device according to claim 23, wherein on the printed wiring board, resin on the interior surface of the aperture unit in the resinous substrate is removed, and an uneven surface is formed.

36. The electronic device according to claim 35, wherein ends of a fibrous stiffener are exposed on the surface.

37. The electronic device according to claim 23, wherein the resinous substrate of the printed wiring board consists of an epoxy resin impregnated with glass cloth.

38. The electronic device according to claim 23, wherein the resinous substrate of the printed wiring board comprising a polyester resin, Bismaleimide-Triazine resin, imide resin, phenol resin, or allyl-containing phenylene ether resin impregnated with paper, glass fiber, or aramid fiber.

39. The electronic device according to claim 23, wherein on the printed wiring board, the material of the fuse unit and the material of the first terminal unit and the second terminal unit are approximately the same.

40. The printed wiring board according to claim 23, wherein a conductor width of the fuse unit is in a range from approximately 0.2 mm to approximately 0.5 mm, and a conductor length of the fuse unit is in a range from approximately 2 mm to approximately 15 mm.

41. The electronic device according to claim 32, wherein the soluble silicate is water glass with sodium silicate as its principal ingredient.

42. The electronic device according to claim 23, wherein the inorganic covering material of the printed wiring board has a coefficient of thermal expansion approximately equal to that of the fuse unit.

43. The electronic device according to claim 42, wherein the fuse unit is formed with copper, and the coefficient of thermal expansion for the inorganic covering material is in a range from approximately 10 ppm/° C. to approximately 25 ppm/° C.

44. The electronic device according to claim 23, wherein the cross-sectional shape of the fuse unit is an approximate trapezoid.

45. The electronic device according to claim 23, wherein the cross-sectional shape of the fuse unit is an approximate rectangle.

46. The printed wiring board according to claim 23, wherein the conductor pattern of the fuse unit is
   a linear pattern whose parts coupling the fuse unit to the first terminal unit and the second terminal unit are thicker,
   a pattern whose parts coupling the fuse unit to the first terminal unit and the second terminal unit are tapered,
   an approximately S-shaped pattern whose pattern curves are curved or straight, or
   a U-shaped pattern that does not proceed directly in the X direction in which the first terminal unit and the second terminal unit are arranged, but instead detours in the Y direction orthogonal to the X direction.

47. The electronic device according to claim 23, wherein a part of the fuse unit of the printed wiring board is a hanging part.

48. The electronic device according to claim 23, wherein the entirety of the fuse unit of the printed wiring board is a hanging part.

49. The electronic device according to claim 23, wherein the first terminal unit, the second terminal unit, and the fuse unit are integrally formed on the printed wiring board.

50. The electronic device according to claim 23, wherein on the printed wiring board, the fuse unit consists of a conductor bar, the two ends of which are respectively coupled to the first terminal unit and the second terminal unit by a conductive adhesive or solder.

* * * * *